United States Patent [19]

Hasegawa et al.

[11] Patent Number: 5,895,741
[45] Date of Patent: Apr. 20, 1999

[54] PHOTOMASK, MANUFACTURE OF PHOTOMASK, FORMATION OF PATTERN, MANUFACTURE OF SEMICONDUCTOR DEVICE, AND MASK PATTERN DESIGN SYSTEM

[75] Inventors: Norio Hasegawa, Hinode; Tsuneo Terasawa, Ome; Hiroshi Fukuda, Kodaira; Katsuya Hayano; Akira Imai, both of Hachioji; Akemi Moniwa, Hannou; Shinji Okazaki, Urawa, all of Japan

[73] Assignee: Hitachi, Ltd., Tokyo, Japan

[21] Appl. No.: 08/906,162

[22] Filed: Aug. 5, 1997

Related U.S. Application Data

[63] Continuation of application No. 08/495,836, Jun. 28, 1995, Pat. No. 5,700,601.

[30] Foreign Application Priority Data

Jun. 29, 1994 [JP] Japan ................... 6-146890
Jul. 27, 1994 [JP] Japan ................... 6-175088
Sep. 14, 1994 [JP] Japan ................... 6-219786

[51] Int. Cl.$^6$ ........................................ G03F 9/00
[52] U.S. Cl. ........................................ 430/5
[58] Field of Search ........................ 430/5, 322, 323, 430/324; 355/53

[56] References Cited

U.S. PATENT DOCUMENTS

| | | |
|---|---|---|
| 4,360,586 | 11/1982 | Flanders et al. |
| 5,397,663 | 3/1995 | Uesawa et al. ............ 430/5 |
| 5,411,823 | 5/1995 | Okamoto .................. 430/5 |
| 5,429,896 | 7/1995 | Hasegawa et al. ......... 430/5 |

FOREIGN PATENT DOCUMENTS

| | | |
|---|---|---|
| 57-62052 | 4/1982 | Japan . |
| 4-136854 | 5/1992 | Japan . |

OTHER PUBLICATIONS

E. Tamechika et al, "Resolution Improvement Using Auxiliary Pattern Groups in Oblique Illumination Lithography", Japan Journal of Applied Physics, vol. 32, 1993, pp. 5856–5862.

VLSI Symposium (1991), Digest of Technical Papers, "Automatic Pattern Generation System for Phase Shifting Mask", pp. 95–96.

Digest of Papers Microprocess '93, "Algorithm for Phase Shift Mask Design with Priority on Shift Placement", pp. 50–51.

Digest of Papers Microprocess '93, "A CAD System for Designing Phase–Shifting Work", pp. 52–53.

IEEE Transactions on Semiconductor Manufacturing, vol. 5, No. 2 (1992), "Binary and Phase Shifting Mask Design for Optical Lithography", pp. 138–152.

Digest of Papers Microprocess '93, "Resolution Improvement Using Auxiliary Pattern Groups in Oblique Illumination Lithography," pp. 44–45.

*Primary Examiner*—S. Rosasco
*Attorney, Agent, or Firm*—Fay, Sharpe, Beall, Fagan, Minnich & McKee

[57] ABSTRACT

A photomask used for printing a mask pattern by projection optics, in which a main pattern formed of a transparent area is provided in a semitransparent area formed of a semitransparent film and a phase shifter, and the phase angles of light beams passing through respective areas are different from each other substantially by 180°. The photomask is intended to prevent a reduction in a production yield due to a resolution failure of the photomask, and to prevent generation of an unnecessary projected image. In this photomask, a transparent auxiliary pattern having the same phase angle of light as that of the transparent area is disposed around a main pattern formed of the transparent area, and a distance D between the center or a desired center line of the main pattern and that of the auxiliary pattern satisfies the relationship of $D = b\lambda/\mathrm{NAm}$, where NAm is a mask-side numerical aperture of a projection lens, $\lambda$ is a wavelength of exposure light, and <b> is a coefficient in the range of $1.35 < b \leq 1.9$.

27 Claims, 29 Drawing Sheets

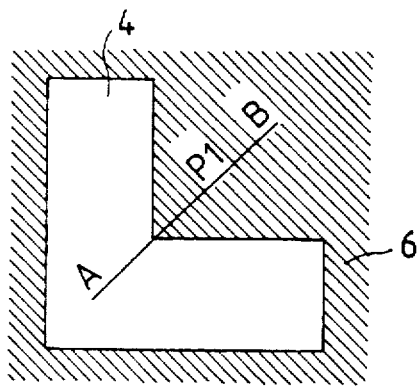 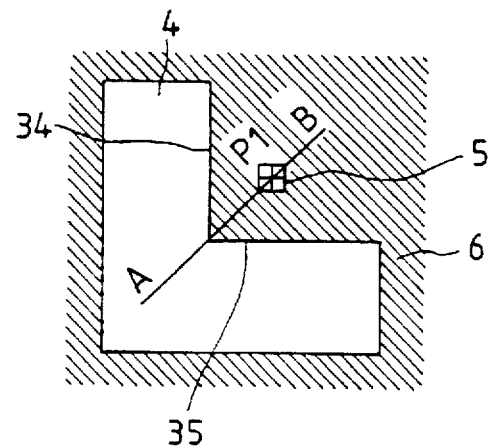
FIG. 14(a)  FIG. 14(b)
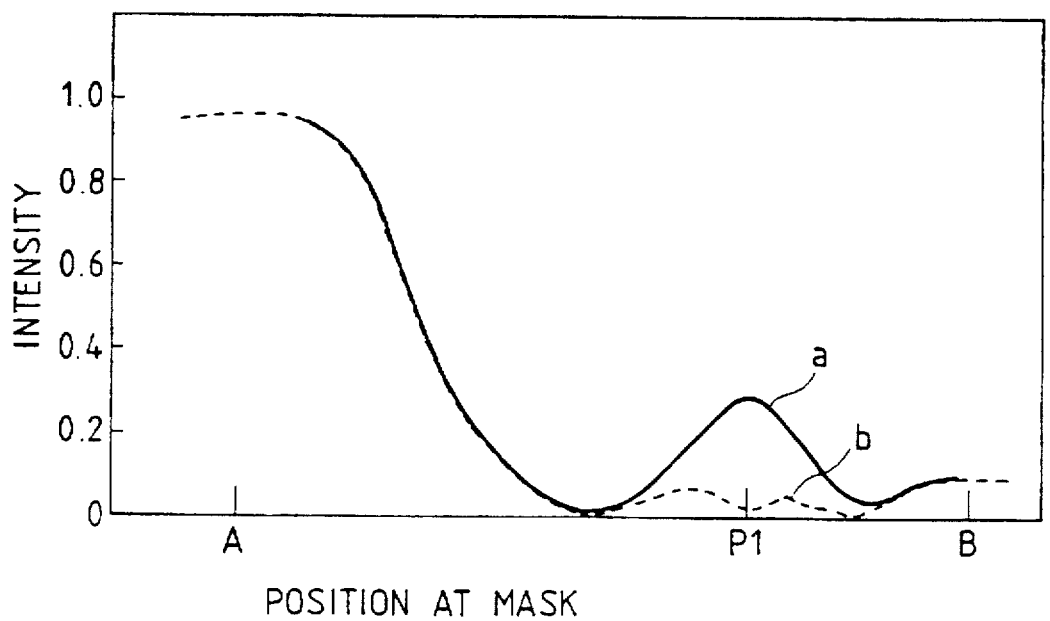
FIG. 15

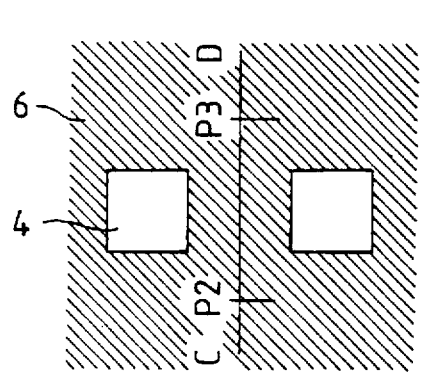
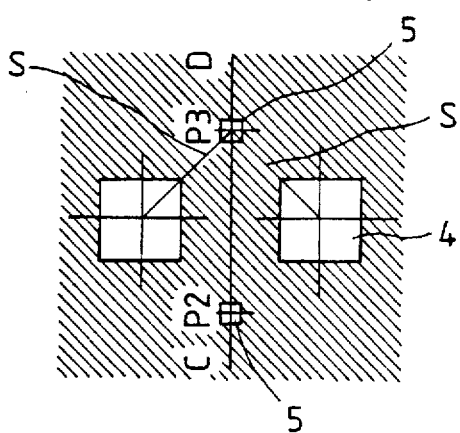
FIG. 16(a)  FIG. 16(b)
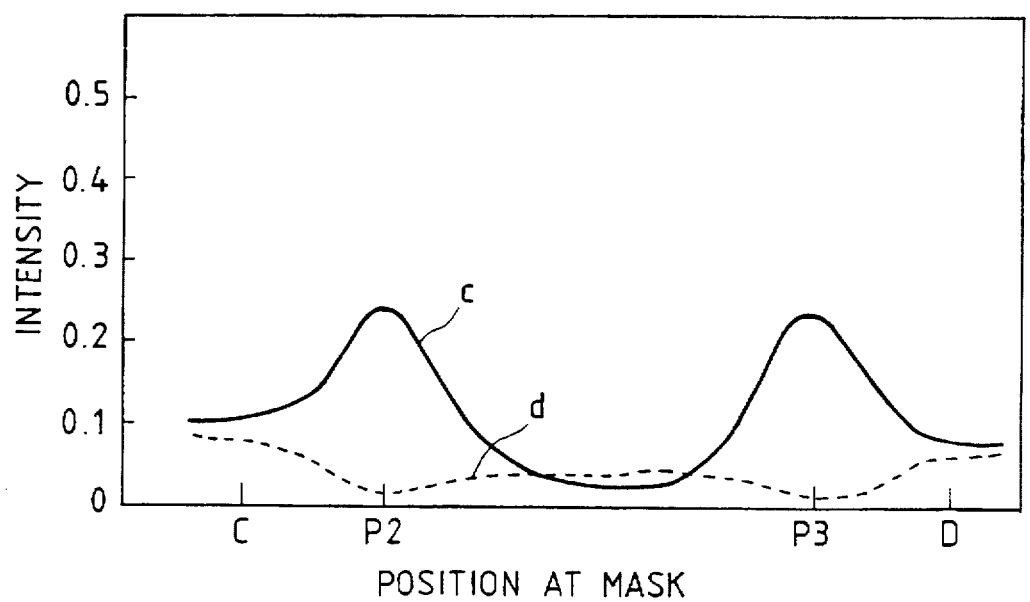
FIG. 17

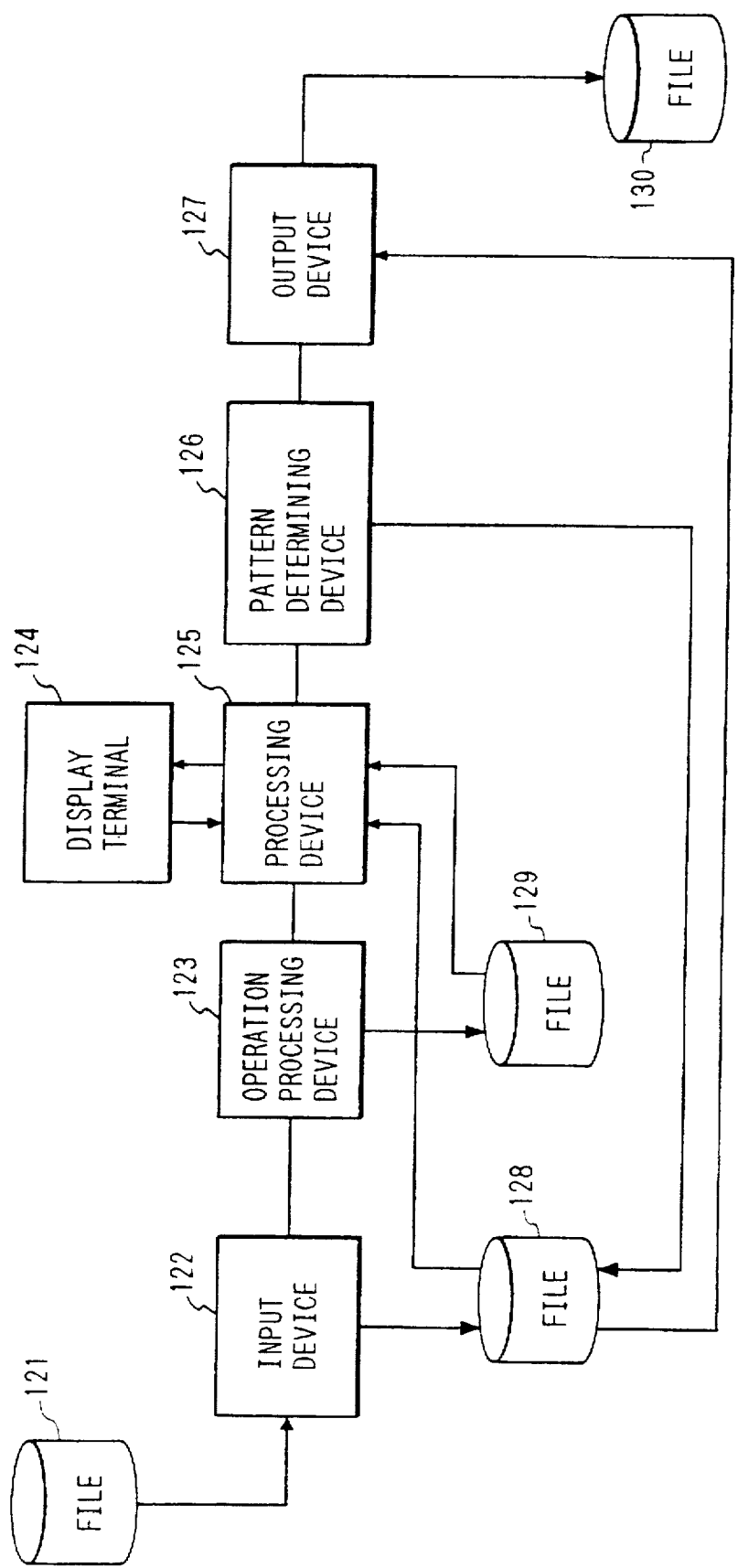

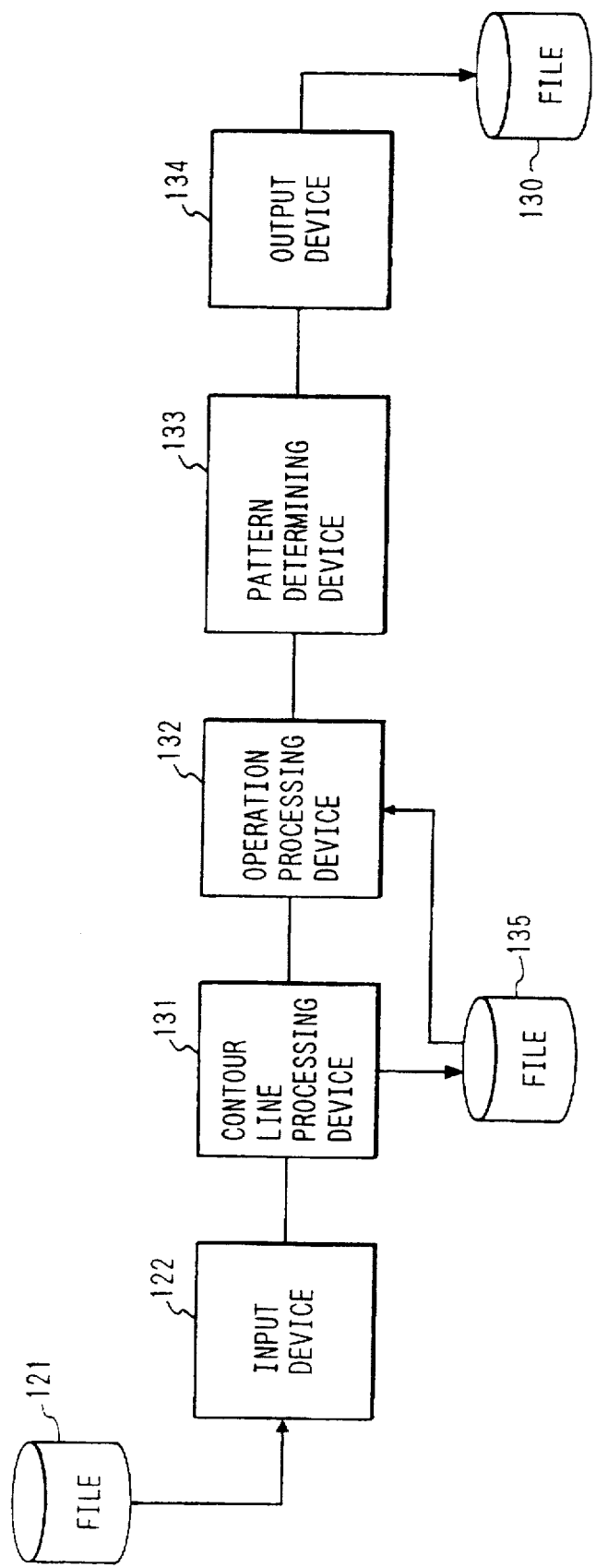

PHOTOMASK, MANUFACTURE OF PHOTOMASK, FORMATION OF PATTERN, MANUFACTURE OF SEMICONDUCTOR DEVICE, AND MASK PATTERN DESIGN SYSTEM

This is a continuation application of U.S. Ser. No. 08/495,836, filed Jun. 28, 1995, now U.S. Pat. No. 5,700,601.

BACKGROUND OF THE INVENTION

The present invention relates to a photomask used for manufacture of semiconductor devices, a method of manufacturing the photomask, a method of forming a pattern using the photomask, a method of manufacturing semiconductor devices using such a pattern formation method, and a mask pattern design system.

A lithography technique of printing a pattern depicted on a mask to be exposed onto a substrate has been extensively used for forming a pattern upon manufacture of a semiconductor device or liquid crystal panel. For this pattern printing, a reduction projection exposure system for printing a pattern depicted on a mask at a specified reduction ratio has been generally used.

To meet the recent tendency of making fine the size of a pattern, the projection exposure system has been required to be enhanced in its resolution. In general, as the numerical aperture of a projection lens (NA) becomes larger, or as the wavelength of exposure light becomes shorter, the resolution of the system becomes higher. However, an increase in the NA reduces the depth of focus upon pattern printing, and the shortening of wavelength of light is variously restricted from the viewpoint of a light source, optical material and resist material.

An attempt has been made to print a finer pattern at a resolution exceeding the conventional limit using the existing projection exposure system. Unexamined Japanese Patent Publication No. SHO 57-62052 discloses a method of providing a transparent film (phase shifter) for inverting the phase angle of light on a specified light passing portion on a mask, thereby significantly improving the resolution for a plurality of periodic patterns.

A technique of automatically arranging the above-described phase shifter has been reported in VLSI Symposium (1991), and has been described in [Digest of Technical Papers , pp. 95–96] titled "Automatic Pattern Generation System For Phase Shifting Mask". The similar techniques have been described in [Digest of Papers Microprocess '93, pp. 50–51] titled "Algorithm for Phase Shift Mask Design with Priority on Shift Placement", and in the same paper (pp. 52–53) titled "A CAD System for Designing Phase-Shifting Mask". A technique for inputting a desired shape of a projected image for determining a mask pattern has been described in [IEEE Transaction on Semiconductor Manufacturing, Vol. 5, No. 2 (1992), pp. 138–152] titled "Binary and Phase Shifting Mask Design for Optical Lithography".

On the other hand, U.S. Pat. No. 4,360,586 has disclosed a photomask of controlling the intensity and phase angle of X-ray or light passing the mask. The similar photomask has been disclosed in Unexamined Japanese Patent Publication No. HEI 04-1368540.

In each of these photomasks, the peripheral portion of a single transparent pattern becomes semitransparent, that is, a usual opaque film of a photomask is made semitransparent, and the phase angle of a slight amount of a light beam passing though the semitransparent portion is inverted relative to the phase angle of a light beam passing through the transparent pattern. Since the light beam passing through the semitransparent portion is inverted in phase angle relative to the light beam passing through the transparent pattern as a main pattern, it is inverted at the boundary therebetween, and thereby the light intensity becomes close to zero at the boundary. As a result, the ratio between the intensity of the light beam passing through the transparent pattern and the light intensity at the boundary is relatively increased Thus, in this photomask, a light intensity distribution being high in contrast as compared with the usual Cr mask can be obtained, and the depth of focus upon pattern formation is nearly doubled. The mask structure can be easily realized only by replacing the conventional Cr mask with a semitransparent film having a phase inversion function. Hereinafter, such a mask is referred to as a halftone phase shift mask (attenuate phase shift mask).

A technique of providing auxiliary patterns at both the ends of each of a plurality of periodic patterns and non-periodic patterns of the similar halftone phase shift mask for improving the shape of a projected image has been described in [Digest of Papers MicroProcess '93, pp. 44–45) titled "Resolution Improvement using Auxiliary Pattern Groups in Oblique Illumination Lithography".

The prior art described in Unexamined Japanese Patent Publication No. SHO 57-62052 can significantly improve the resolution for a plurality of periodic patterns; however, a method of arranging a phase shifter for a usual non-periodic pattern has not been described.

The prior art described in [Digest of Technical Papers, pp. 95–96], [Digest of Papers MicroProcess '93, pp. 50–51 and pp. 52–53] and [IEEE Transaction on Semiconductor Manufacturing, Vol. 5, No. 2 (1992), pp. 138–152] relate to a method of automatically arranging a phase shifter on a light passing portion on a mask.

In the halftone phase shift mask, since a slight amount of passing light is present in an area to be shielded, the passing light is emphasized by an interference effect when the patterns are close to each other, and consequently, there arises a problem that a projected image having a light intensity level that is not negligible is formed on a portion where a pattern should not be present.

Even in the usual Cr mask, there arises the similar problem that a projected image is formed on a portion where a pattern should not be present by an interference effect, although the interference effect is lower than in the halftone phase shift mask.

The prior art reference do not describe a method of solving the above-described problem due to the interference effect.

The prior art described in U.S. Pat. No. 4,360,586 and Unexamined Japanese Patent Publication No. HEI 04-136854 fail to solve the problem of reducing the depth of focus of a fine pattern. Therefore, they present problems that upon manufacture of a fine element, a production yield is reduced due to a resolution failure, and that a projected image is formed on a portion where a pattern should not be present.

The prior art described in [Digest of Papers MicroProcess '93, pp. 44–45] uses an annular illumination as a light source exposure and no description is made for a system with a low annular condition σ.

SUMMARY OF THE INVENTION

A first object of the present invention is to provide a photomask for preventing a reduction in production yield due to a resolution failure, thereby forming a fine pattern.

A second object of the present invention is to provide a method of forming a pattern using such a photomask.

A third object of the present invention is to provide a method of manufacturing a semiconductor device which is formed with a fine pattern using such a photomask.

A fourth object of the present invention is to provide a photomask for preventing the generation of an unnecessary projected image, thereby preventing the printing of an unnecessary pattern.

A fifth object of the present invention is to provide a method of forming a pattern using such a photomask.

A sixth object of the present invention is to provide a method of manufacturing a semiconductor device which is formed with a fine pattern using such a photomask.

A seventh object of the present invention is to provide a mask pattern design system for designing such a photomask.

An eighth object of the present invention is to provide a method of manufacturing such a photomask.

A ninth object of the present invention is to provide a method of forming a pattern using a photomask manufactured by such a method of manufacturing a photomask.

To achieve the first object of the present invention, according to the present invention, there is provided a photomask comprising a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of a light beam passing therethrough as that of a light beam passing through the transparent area is disposed around a main pattern formed of the transparent area, and a distance D between the center or a desired center line of the main pattern and that of the auxiliary pattern satisfies the relationship of D=bλ/NAm , where NAm is a mask-side numerical aperture of projection lens, λ is a wavelength of exposure light, and <b> is a coefficient in the range of 1.35<b≦1.9.

The difference in the phase angle between the transparent area and the semitransparent area is substantially 180°. This means that the difference may be deviated from 180° to some extent; or it may be the odd-number (three or more) times of 180° or may be deviated therefrom to some extent. For example, in the case of the difference in the phase angle of light is three times of 180°, the same effect can be theoretically obtained In this case, however, the increased thickness of the phase shift film generates a loss in reflection of light from the wall surface of an auxiliary pattern. The same is true for the following cases.

To achieve the first object of the present invention, according to the present invention, there is also provided a photomask comprising a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of a light beam passing therethrough as that of a light beam passing through the transparent area is disposed around a main pattern formed of the transparent area, and the auxiliary pattern is provided on an area of the photomask corresponding to an area of the projected main pattern which is located outwardly from an intermediate point between a first sub-peak and a second sub-peak generated around the projected main pattern and inwardly from the second sub-peak.

A plurality of sub-peaks exist around an image of the main pattern projected in a state being little out of focus, which are called a first sub-peak and a second sub-peak from the side near the peak of the main pattern. The first sub-peak is located at a position corresponding to the coefficient <b> being about 0.9, and the second sub-peak is located at a position corresponding to the coefficient <b> being about 1.8. Accordingly, the area outwardly from an intermediate point between the first sub-peak and second sub-peak and inwardly from the second sub-peak corresponds to an area having the coefficient <b> in the range of 1.35≦b≦1.8.

In each of the above cases, the auxiliary pattern is preferably formed in a size not to be singly printed. For examples the width of the auxiliary pattern is preferably expressed by the relationship of b'λ/NAm, where NAm is a mask-side numerical aperture of projection lens, λ is a wavelength of exposure light, and the coefficient <b'> is in the range of 0.07<b≦0.25.

As described above, by arrangement of an auxiliary pattern at an optimum position around a main pattern of a photomask in which the phase angle of a light beam passing through the transparent main pattern is inverted from that of a light beam passing through a semitransparent portion disposed around the main pattern, it becomes possible to suppress a reduction in the light intensity of the main pattern even when the focus is shifted upon pattern printing, and hence to avoid a reduction in the pattern size and resolution failure due to being out of focus.

To achieve the second object of the present invention, there is provided a method of forming a pattern comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of a light beam passing therethrough as that of a light beam passing through the transparent area is disposed around a main pattern formed of the transparent area, and a distance D between the center or a desired center line of the main pattern and that of the auxiliary pattern satisfies the relationship of D=bλ/NAm g where NAm is a mask-side numerical aperture of a projection lens, λ is a wavelength of exposure lights and <b> is a coefficient in the range of 1.35<b≦1.9;

(b) exposing a thin film made of a photoresist formed on a substrate using the photomask by projection optics; and (c) forming a pattern by development.

To achieve the second object of the present invention, according to the present invention, there is also provided a method of forming a pattern comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of a light beam passing therethrough as that of a light beam passing through the transparent area is disposed around a main pattern formed of the transparent area, and the auxiliary pattern is provided on an area of the photomask corresponding to an area of the projected main pattern which is located outwardly from an intermediate point between a first sub-peak and a second sub-peak generated around the projected main pattern and inwardly from the second sub-peak;

(b) exposing a thin film made of a photoresist formed on a substrate using the photomask by projection optics; and (c) forming a pattern by development.

In each of the above cases, the exposure is preferably performed under a condition that a coherence factor σ of the projection optics satisfies the relationship of σ≦0.3, and is more preferably under the condition of σ≦0.2.

To achieve the third object of the present invention, there is provided a method of manufacturing a semiconductor device, comprising (a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) determining a first auxiliary pattern of a specified shape on a position in which a distance between the center or a specified center line of the main pattern and that of the first auxiliary pattern satisfies the relationship of D=b"λ/NAm where NAm is a mask-side numerical aperture of a projection lens, λ is a wavelength of exposure light, and <b"> is a coefficient, on the basis of data of the main pattern and parameters representing an optical condition of the projection optics, (2) judging a contradiction portion of the first auxiliary pattern, and (3) determining an auxiliary pattern to be arranged on the basis of the first auxiliary pattern and the contradiction portion, (b) forming the main pattern and the auxiliary pattern to be arranged, on the photomask, and (c) projecting and exposing a pattern on a thin film made of a photoresist formed on a semiconductor substrate using the photomask formed with the main pattern and the auxiliary pattern to be arranged, thereby forming at least part of a pattern of a semiconductor device.

The above coefficient <b"> may be in the range of 1.0≦b"≦2.0, preferably, in the range of 1.35≦b"≦1.9.

The determination of the first auxiliary pattern is preferably performed by the step of detecting a main pattern having a size being a specified value or less, and determining the first auxiliary pattern at the position for the detected main pattern. When the size of the pattern is large, the focus depth thereof is large; accordingly, in this case, an effect of out of focus exerted on the light intensity is small even when any auxiliary pattern is not provided. An auxiliary pattern, therefore, may be disposed for a main pattern having a size being a specified value or less.

To achieve the third object of the present invention, according to the present invention, there is also provided a method of manufacturing a semiconductor device, comprising:

(a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) calculating a light intensity distribution of a projected image of the main pattern on the basis of data of said main pattern and parameters representing an optical condition of the projection optics, (2) determining a first auxiliary pattern of a specified shape on an area of the photomask corresponding to an area of the projected main pattern which is located outwardly from an intermediate point between a first sub-peak and a second sub-peak generated around the projected main pattern and inwardly from the second sub-peak, (3) judging a contradiction portion of the first auxiliary pattern, and (4) determining an auxiliary pattern to be arranged on the basis of the first auxiliary pattern and the contradiction portion, (b) forming the main pattern and the auxiliary pattern to be arranged, on the photomask, and (c) projecting and exposing a pattern on a thin film made of a photoresist formed on a semiconductor substrate using the photomask formed with the main pattern and the auxiliary pattern to be arranged, thereby forming at least part of a pattern of a semiconductor device.

Even in this case, the determination of the first auxiliary pattern is preferably performed by the step of detecting a main pattern having a size being a specified value or less, and determining the first auxiliary pattern at the position for the detected main pattern.

To achieve the third object of the present invention, according to the present invention, there is also provided a method of manufacturing a semiconductor device, comprising:

(a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) calculating a light intensity distribution of a projected image of the main pattern on the basis of data of said main pattern and parameters representing an optical condition of the projection optics, (2) determining a first auxiliary pattern of a specified shape on an area of the photomask corresponding to an area of the projected main pattern which is located outwardly from an intermediate point between a first sub-peak and a second sub-peak generated around the projected main pattern and inwardly from the second sub-peak, (3) judging a contradiction portion of the first auxiliary pattern, and
(4) determining a projected image of an auxiliary pattern to be arranged on the basis of the first auxiliary pattern and the contradiction portion,
(5) determining an auxiliary pattern to be arranged, on an area of the photomask corresponding to the projected image on the basis of the projected image of the auxiliary pattern to be arranged, (b) forming the main pattern and the auxiliary pattern to be arranged, on the photomask, and (c) projecting and exposing a pattern on a thin film made of a photoresist formed on a semiconductor substrate using the photomask formed with the main pattern and the auxiliary pattern to be arranged, thereby forming at least part of a pattern of a semiconductor device.

Even in this case, the determination of the first auxiliary pattern is preferably performed by the step of detecting a main pattern having a size being a specified value or less, and determining the first auxiliary pattern for the detected main pattern on the area outwardly from an intermediate point between the first sub-peak and the second sub-peak and inwardly from the second sub-peak To achieve the fourth object of the present invention, according to the present invention, there is provided a photomask comprising a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of light as that of the main pattern is disposed at an area where an angle formed by intersections of desired two sides or extension lines thereof of a main pattern formed of the transparent area is less than 180° in the semitransparent area.

It is preferable to dispose auxiliary pattern when the angle formed by intersections of desired two sides or extension lines thereof of a main pattern is less than 110° in the semitransparent area. The dimension of at least one side of the auxiliary pattern is preferably a resolution limit of projection optics using the photomask or less. The center of the auxiliary pattern is preferably located at a position in which a distance D from the two sides of the main pattern satisfies the relationship of D=dλ/NAm , where NAm is a mask-side numerical aperture of a projection lens, λ is a wavelength of exposure light, and <d> is a coefficient in the range of 0.4≦d≦0.7.

To achieve the fourth object, according to the present invention, there is also provided a photomask comprising a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of light as that of the main pattern and having a dimension being a resolution limit of projection optics or less is disposed at an area of the photomask corresponding to a position where interference light beams from different two sides of a main pattern formed of the transparent area are emphasized to each other.

To achieve the fourth object of the present invention, there is also provided a photomask comprising a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position in which a distance S from the centers of the two main patterns satisfies the relationship of S=sλ/NAm, where NAm is a mask-side numerical aperture of a projection lens, λ is a wavelength of exposure light, and <s> is a coefficient in the range of 0.8≦s≦1.1

To achieve the fourth object of the present invention, there is also provided a photomask comprising a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position of the photomask corresponding to a position where first sub-peaks around main peaks of the projected main patterns are overlapped to each other.

To achieve the fourth object of the present invention, there is also provided a photomask comprising a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position of the photomask corresponding to a position where diffraction light beams from the main patterns are overlapped to each other at the same phase angle.

In each of these photomasks, it becomes possible to cancel an unnecessary light intensity peak by arrangement of a transparent auxiliary pattern having the same phase angle of light as that of a main pattern at a position of the mask corresponding to a position where the unnecessary light intensity peak is generated. Namely, the light beam passing through the position where the unnecessary light intensity peak is generated is canceled by allowing a light beam having an inverted phase angle of light from that of the light beam passing through the unnecessary position to pass through the auxiliary pattern. Accordingly, the auxiliary pattern requires a size enough to obtain a light intensity for canceling the unnecessary light beam; however, when it has a size over the suitable value, an adverse effect is generated.

To achieve the fifth object of the present invention, according to the present invention, there is provided a method of forming a photomask comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein a transparent auxiliary pattern having the same phase angle of light as that of the main pattern is disposed at an area where an angle formed by intersections of desired two sides or extension lines thereof of a main pattern formed of the transparent area is less than 180° in the semitransparent area;

(b) exposing a photoresist formed on a substrate by projection optics using the photomask; and (c) forming a pattern by development.

To achieve the fifth object of the present invention, according to the present invention, there is provided a method of forming a photomask comprising the steps of:

(a) preparing a photomask, the photomask including a semitransparent area and a transparent area for at least exposure lights in which the phase angle of a light beam passing through the semitransparent area is different from the phase angle of a light beam passing through the transparent area substantially by 180°, wherein a transparent auxiliary pattern having the same phase angle of light as that of the main pattern and having a dimension being a resolution limit of projection optics or less is disposed at an area of the photomask corresponding to a position where interference light beams from different two sides of a main pattern formed of the transparent area are emphasized to each other;

(b) exposing a photoresist formed on a substrate by projection optics using the photomask; and (c) forming a pattern by development.

To achieve the fifth object of the present invention, according to the present invention, there is also provided a method of forming a photomask comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position in which a distance S from the centers of the two main patterns satisfies the relationship of S=sλ/NAm, where NAm is a mask-side numerical aperture of a projection lens, λ is a wavelength of exposure light, and <s> is a coefficient in the range of 0.8≦s≦1.1;

(b) exposing a photoresist formed on a substrate by projection optics using the photomask; and (c) forming a pattern by development.

To achieve the fifth object of the present invention, according to the present invention, there is also provided a method of forming a photomask comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position of the photomask corresponding to a position where first sub-peaks around main peaks of the projected main patterns are overlapped to each other;

(b) exposing a photoresist formed on a substrate by projection optics using the photomask; and (c) forming a pattern by development.

To achieve the fifth object of the present invention, according to the present invention, there is also provided a method of forming a photomask comprising the steps of:

(a) preparing a photomask, the photomask including a semitransparent area and a transparent area for at least exposure light, in which the phase angle of a light beam passing through the semitransparent area is different from the phase angle of a light beam passing through the transparent area substantially by 180°, wherein at least two main patterns each being formed of the transparent area are disposed, and a transparent auxiliary pattern having the same phase angle of light as that of the main pattern and having a dimension being a resolution limit of projection optics or less is disposed at a position of the photomask corresponding to a position where diffraction light beams from the main patterns are overlapped to each other at the same phase angle;

(b) exposing a photoresist formed on a substrate by projection optics using the photomask; and (c) forming a pattern by development.

To achieve the sixth object of the present inventions according to the present invention, there is provided a method of manufacturing a semiconductor device, comprising:

(a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) detecting an area where an angle formed by intersections of desired two sides or extension lines thereof of the main pattern is less than 180° in the semitransparent portion, on the basis of data of the main pattern, and (2) determining a specified auxiliary pattern in the area where the angle is less than 180°, when the area is detected, at a position separated from the desired two sides of the main pattern at specified distances;

(b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

To achieve the sixth object of the present invention, according to the present invention, there is also provided a method of manufacturing a semiconductor device, comprising:

(a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) detecting, on the basis of data of at least two of the main patterns and parameters of an optical condition of the projection optics, a position in which a distance S from the centers of the main patterns satisfies the relationship of $S=s\lambda/NAm$, where NAm is a mask-side numerical aperture of a projection lens, $\lambda$ is a wavelength of exposure light, and $<s>$ is a coefficient in the range of $0.8 \leq s \leq 1.1$, and (2) determining an auxiliary pattern having a dimension of a resolution limit or less of the projection optics at the position satisfying the relationship when the position is detected;

(b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

To achieve the sixth object of the present invention, according to the present invention, there is also provided a method of manufacturing a semiconductor device, comprising (a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary pattern comprising the steps of:

(1) calculating, on the basis of data of at least two of the main patterns and parameters representing an optical condition of the projection optics, light intensity distributions of projected images of the main patterns, (2) detecting a position where first sub-peaks around main peaks of the main patterns in the light intensity distributions of the projected images of the main patterns are overlapped to each other, and (3) determining an auxiliary pattern having a dimension of a resolution limit or less of the projection optics at a position of the photomask corresponding to the position when the position is detected;

(b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

To achieve the sixth object of the present invention, according to the present invention, there is also provided a method of manufacturing a semiconductor device, comprising:

(a) preparing a photomask including a semitransparent area and a transparent area for at least exposure light, in which the phase angle of a light beam passing through the semitransparent area is different from the phase angle of a light beam passing through the transparent area substantially by 180° and the main pattern is formed of the transparent area; and determining an auxiliary transparent pattern having the same phase angle of a light beam passing therethrough as that of a light beam passing through the transparent area around the main pattern by a mask pattern design system, the process of determining the auxiliary-pattern comprising the steps of:

(1) detecting, on the basis of data of at least two of the main patterns and parameters representing an optical condition of the projection optics, a position where diffraction light beams from the main patterns are overlapped to each other at the same phase angle, and (2) determining an auxiliary pattern having a dimension of a resolution limit or less of the projection optics at a position of the photomask corresponding to the position when the position is detected;

(b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

To achieve the sixth object of the present invention, according to the present invention, there is also provided a method of manufacturing a semiconductor device comprising the steps of:

(a) determining an auxiliary pattern of a photomask used for pattern printing by projection optics using a mask pattern design system, the process of determining the auxiliary pattern comprising the steps of:

(1) calculating, on the basis of data of at least one main pattern forming the photomask and parameters representing an optical condition of the projection optics, a light intensity distribution of a projected image of the main pattern obtained by the projection optics, (2) determining an area where a light intensity is more than a specified value, excluding an area corresponding to the main pattern, on the basis of the light intensity distribution of the projected image, and (3) determining one or a plurality of auxiliary patterns on an area of the photomask corresponding to the area where the light intensity is more than the specified value when the area is determined, (b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

The photomask is preferably composed of a halftone phase shift mask comprising a semitransparent area and a transparent area for at least exposure light, in which the phase angle of a light beam passing through the semitransparent area is different from the phase angle of a light beam passing through the transparent area substantially by 180°, and each of the main pattern and the auxiliary pattern is formed of the transparent area and has the same phase angle of light.

One example of calculation of the above-described light intensity distribution of an projected image will be described by example of a halftone phase shift mask. FIG. 32(a) is a plan view of a conventional halftone phase shift mask; FIG. 32(b) is a sectional view of FIG. 32(a); FIG. 32(c) is a graph showing the amplitude distribution of a light beam passing through the mask; FIG. 32(d) is a graph showing the amplitude distribution of a light beam on a substrate to be exposed; and FIG. 32(e) is a graph showing a light intensity distribution on the substrate to be exposed.

As shown in FIGS. 32(a) and 32(b), the halftone phase shift mask includes a halftone shift portion 6 and an opened main pattern 4 formed on an optically transparent substrate 42 formed with a halftone member 43. A light beam passing through the halftone phase shift portion 6 is inverted in the phase angle of light from a light beam passing through the main pattern 4, as shown in the amplitude distribution in FIG. 32(c). The curve 45 in FIG. 32(d) shows the amplitude distribution of light on a substrate to be exposed through projection optics, and the light intensity distribution 47 in FIG. 32(e) is obtained by raising the absolute value of the amplitude distribution shown by the curve 45 to the second power.

The light intensity distribution 47 is finally obtained by inputting data of the main pattern and an optical condition of exposure by means of a means for calculating a projected image. Here, a negative amplitude peak 46 is generated near the pattern edge, which becomes a sub-peak 48 of the projected image. In particular, when two or more of the opening patterns are close to each other, the sub-peaks corresponding to these patterns are emphasized, with a result that an unnecessary projected image is generated nearly at a position separated from the pattern edge nearly by a distance $L_1$.

The generated position of the above-described unnecessary sub-peak can be easily detected by calculating the light intensity distribution of a projected image of the mask pattern and comparing the shape of the image predicted from the light intensity distribution with the inputted pattern shape. Here, the sub-peak generated near the pattern edge is due to the amplitude of a light beam inverted in the phase angle from a light beam passing through the main pattern.

FIG. 33(a) is a plan view of a halftone phase shift mask of the present invention; FIG. 33(b) is a sectional view of FIG. 33(a); and FIG. 33(c) is a view showing the amplitude distribution of light on a substrate to be exposed. By provision a new auxiliary pattern 5 at a position separated from the edge of the main pattern 4 nearly by a distance $L_1$, as shown in FIGS. 33(a) and 33(b), the negative amplitude peak portion in the amplitude distribution 52 is overlapped to an amplitude distribution of the auxiliary pattern 5 as shown in FIG. 33(c), thus making it possible to prevent the generation of the sub-peak. In this case, the auxiliary pattern 5 has a size not to be singly printed. Namely, the width of the auxiliary pattern 5 is preferably in the range of about 0.05 λ/NA to 0.4 λ/NA on the substrate to be exposed, where λ is the wavelength of exposure light, and NA is a numerical aperture of a projecting lens for exposure. In other words, the width of the auxiliary pattern 5 is preferably in the range of about 0.05 λ/NAm to 0.4 λ/NAm on the mask, where NAm is a mask-side numerical aperture of a projecting lens for exposure.

To achieve the sixth object of the present invention, according to the present invention, there is also provided a method of manufacturing a semiconductor device comprising the steps of:

(a) determining an auxiliary pattern of a photomask used for pattern printing by projection optics using a mask pattern design system, the process of determining the auxiliary pattern comprising the steps of:

(1) moving, on the basis of data of at least two of main pattern forming the photomask, an contour line of each of the main patterns outwardly by a specified distance L, thereby determining the enlarged contour line of each of the main patterns, (2) detecting a position where the enlarged contour lines are close to each other at a specified distance M or less, and (3) determining one or a plurality of auxiliary patterns of a specified shape on the position where the enlarged contour lines are close to each other when the position is determined, (b) forming the main pattern and the determined auxiliary pattern on the photomask, and (c) projecting and exposing a pattern on a thin film made of a photoresist formed on a semiconductor substrate using the photomask formed with the main pattern and the determined auxiliary pattern, thereby forming at least part of a pattern of a semiconductor device.

In this case, the photomask is preferably composed of a halftone phase shift mask comprising a semitransparent area and a transparent area for at least exposure light, in which the phase angle of a light beam passing through the semitransparent area is different from the phase angle of a light beam passing through the transparent area substantially by 180° and each of the main pattern and the auxiliary pattern is formed of the transparent area and has the same phase angle of light.

The specified distance L preferably satisfies the relationship of $L=k_1\lambda/NAm$, where NAm is a mask-side numerical aperture of a projection lens, λ is a wavelength of exposure light, and $<k_1>$ is a coefficient in the range of $0.4 \leq k_1 \leq 1.1$. Moreover, the auxiliary pattern is preferably formed in a shape of a square, rectangle or the combination thereof, and the length of one side (in the case of the square) or of short-side (in the case of the rectangle) is $k_2\lambda/NAm$, where NAm is a mask-side numerical aperture of a projection lens, λ is a wavelength of exposure light, and $<k_2>$ is a coefficient in the range of $0.05 \leq k_2 \leq 0.4$.

The formation of an auxiliary pattern of this photomask will be described. The position where a sub-peak is generated as shown in FIG. 32(d) can be optically predicted. The distance $L_1$ shown in FIG. 32(d) is about 0.55 λ/NA. However, since being changed depending on the focus position, the distance $L_1$ is in the range of $0.4 \lambda/NA < L_1 < 1.1 \lambda/NA$ on the substrate to be exposed, and is in the range of $0.4 \lambda/NAm < L_1 < 1.1 \lambda/NAm$ on the mask. Accordingly, the contour line of each main pattern is moved outwardly by a specified distance $L_1$, to obtain an enlarged contour line, and then a portion where the enlarged contour lines are close to each other is obtained. The portion where the sub-peaks are emphasized to each other is thus obtained. By disposing an auxiliary pattern at this portion, a desirable projected image can be obtained.

To achieve the seventh object of the present invention, according to the present invention, there is provided a mask pattern design system comprising:

a calculating means for calculating, on the basis of data of at least one main pattern forming a photomask used for projection optics, a light intensity distribution of a projected image of the main pattern obtained by the projection optics;

a first determining means for determining an area where a light intensity is more than a specified value, excluding an area corresponding to the main pattern, on the basis of the light intensity distribution of the projected image and the main pattern; and a second determining means for determining one or a plurality of auxiliary patterns in an area of the photomask corresponding to the area where the light intensity is more than the specified value when the area is detected.

To achieve the seventh object of the present invention, according to the present invention, there is also provided a mask pattern design system comprising:

a first determining means for moving, on the basis of data of at least two of main pattern forming the photomask used for a projection optics, an contour line of each of the main patterns outwardly by a specified distance L, thereby determining the enlarged contour line of each of the main patterns, a detecting means for detecting a position where the enlarged contour lines are close to each other at a specified distance M or less, and a second determining means for determining one or a plurality of auxiliary patterns of a specified shape on the position where the enlarged contour lines are close to each other when the position is determined.

The above mask pattern design system may include a display means for displaying the main pattern, determined auxiliary pattern and the light intensity distribution of a projected image. The display means may simultaneously or sequentially display the whole area or partial area of the photomask.

To achieve the eighth object of the present invention, according to the present invention, there is provided a method of manufacturing a photomask comprising the steps of:

(a) determining an auxiliary pattern of a photomask used for pattern printing by projection optics using a mask pattern design system, the process of determining the auxiliary pattern comprising the steps of:

(1) calculating, on the basis of data of at least two of main patterns formed in the photomask and parameters representing an optical condition of the projection optics, a light intensity distribution of a projected image of the main pattern obtained by the projection optics, (2) determining an area where a light intensity is more than a specified value, excluding an area corresponding to the main pattern, on the basis of the light intensity distribution of the projected image and the main patterns, and (3) determining one or a plurality of auxiliary patterns on an area of the photomask corresponding to the area where the light intensity is more than the specified value when the area is determined, and (b) forming the main pattern and the determined auxiliary patterns on the photomask.

To achieve the eighth object of the present invention according to the present invention, there is also provided a method of manufacturing a photomask comprising the steps of:

(a) determining an auxiliary pattern of a photomask used for pattern printing by projection optics using a mask pattern design system, the process of determining the auxiliary pattern comprising the steps of:

(1) moving, on the basis of data of at least two of main pattern forming the photomask, an contour line of each of the main patterns outwardly by a specified distance L, thereby determining the enlarged contour line of each of the main patterns, (2) detecting a position where the enlarged contour lines are close to each other at a specified distance M or less, and (3) determining one or a plurality of auxiliary patterns of a specified shape on the position where the enlarged contour lines are close to each other when the position is determined; and (b) forming the main pattern and the determined auxiliary pattern on the photomask.

The photomask is preferably composed of a halftone phase shift mask comprising a semitransparent area and a transparent area for at least exposure light, in which the phase angle of a light beam passing through the At semitransparent area is different from the phase angle of a light beam-passing through the transparent area substantially by 180°, and each of the main pattern and the auxiliary pattern is formed of the transparent area and has the same phase angle of light.

To achieve the ninth object of the present invention, there is provided a method of forming a pattern comprising the steps of:

(a) determining an auxiliary pattern of a photomask used for pattern printing by projection optics using a mask pattern design system, the process of determining the auxiliary pattern comprising the steps of:

(1) calculating, on the basis of data of at least two of main patterns formed in the photomask and parameters representing an optical condition of the projection optics, a light intensity distribution of a projected image of the main pattern obtained by the projection optics, (2) determining an area where a light intensity is more than a specified value, excluding an area corresponding to the main pattern, on the basis of the light intensity distribution of the projected image and the main patterns, and (3) determining one or a plurality of auxiliary patterns on an area of the photomask corresponding to the area where the light intensity is more than the specified value when the area is determined, and (b) forming the main pattern and the determined auxiliary patterns on the photomask; and (c) projecting and exposing a pattern by projection optics using the photomask formed with the main pattern and the determined auxiliary patterns.

To achieve the ninth object of the present invention, according to the present invention, there is also provided a method of forming a pattern comprising the steps of:

(a) determining an auxiliary pattern of a photomask used for pattern printing by projection optics using a mask pattern design system, the process of determining the auxiliary pattern comprising the steps of:

(1) moving, on the basis of data of at least two of main pattern forming the photomask, an contour line of each of the main patterns outwardly by a specified distance L, thereby determining the enlarged contour line of each of the main patterns, (2) detecting a position where the enlarged contour lines are close to each other at a specified distance M or less, and (3) determining one or a plurality of auxiliary patterns of a specified shape on the position where the enlarged contour lines are close to each other when the position is determined; and (b) forming the main pattern and the determined auxiliary pattern on the photomask; and (c) projecting and exposing a pattern by projection optics using the photomask formed with the main pattern and the determined auxiliary patterns.

BRIEF DESCRIPTION OF THE DRAWINGS

FIG. 14(a) is a plan view of a conventional photomask;

FIG. 14(b) is a plan view of a photomask in Embodiment 7 of the present invention;

FIG. 15 is a characteristic view showing a light intensity distribution of a light beam passing through the photomask shown in FIG. 14(a) and FIG. 14(b);

FIG. 16(a) is a plan view of a conventional photomask;

FIG. 16(b) is a plan view of a photomask in Embodiment 8 of the present invention;

FIG. 17 is a characteristic view showing the light intensity distribution of a light beam passing through the photomask shown in FIG. 16(a) and FIG. 16(b);

FIG. 40 is a block diagram showing the construction of a mask pattern design system in Embodiment 14 of the present invention; and FIG. 41 is a block diagram showing the construction of a mask pattern design system in Embodiment 16 of the present invention.

DETAILED DESCRIPTION OF PREFERRED EMBODIMENTS

<Comparative Example>

Figure 2A:
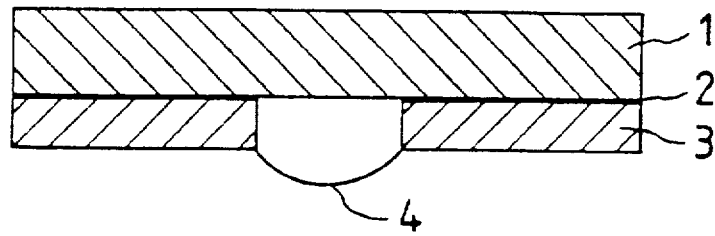
FIG. 2(a) is a sectional view of a photomask in Comparative Example.

For comparison with the present invention, a conventional example will be first described with reference to FIGS. 2(a) and 2(b). FIG. 2(a) is a sectional view of a conventional halftone phase shift mask. In this figure, reference numeral 1 indicates a glass substrate; 2 is a semitransparent film; and 3 is a phase shifter. A Cr film was used as the semitransparent film 2, and spin-on-glass was used as the phase shifter 3. The transmittance of the semitransparent film 2 was set at 9% relative to the intensity of exposure light passing through a transparent portion. The transmittance of the semitransparent portion is not limited thereto; however, when the transmittance is excessively increased, the thinning of a resist film tends to be generated around a main pattern, and accordingly, in terms of practical use, the transmittance may be in the range of 20% or less. When it is less than 1%, the semitransparency cannot be obtained. Accordingly, it is preferably in the range of 1% or more. The transmittance is more preferably in the range of from 3 to 20%. The projected main pattern 4 was formed in a circular shape having a diameter of 0.6 μm. (In the projection optical system used here, the reduction ratio is 1/5, and therefore, the actual dimensions on the mask become five times. Hereinafter, the dimensions on the mask will be similarly represented.)

Figure 2B:
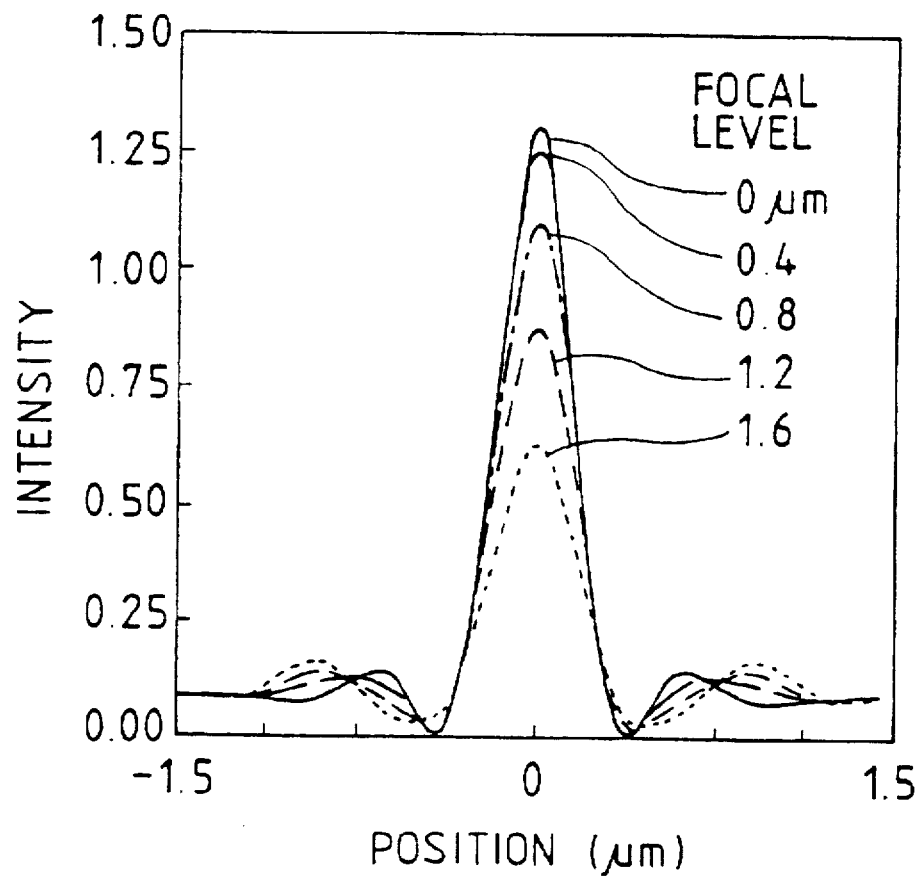
FIG. 2(b) is a view showing the intensity of a light beam passing through the photomask shown in FIG. 2(a)

FIG. 2(b) shows a light intensity distribution on a pattern printing surface obtained in this mask through simulation, wherein a numerical aperture of a projection lens (NA) is 0.52; the wavelength of exposure light is 0.36 μm; the coherence σ of an illumination system is 002; and the out of focus is set at 0, 0.4, 0.8, 1.2, and 106 μm. As is apparent from FIG. 2(b), the intensity distribution becomes extremely sharp when the out of focus is 0 μm. However, as the focus position is shifted, the light intensity at the center of the main pattern 4 is lowered, and when the out of focus is 1.6 μm, the light intensity becomes nearly the half.

A pattern was actually printed on a resist using this mask. A usual positive resist was applied on a silicon substrate to a thickness of 1 μm, and a pattern was printed on the resist in the usual manner. The amount of exposure light was set such that the diameter of the resoluble main pattern was 0.3 μm when the out of focus was 0 μm. Under the same exposure condition, the exposure was performed at the out of exposure of 0.8 μm, with a result that the diameter of the resoluble pattern become about 0.25 μm. For the out of focus of 12 μm, the pattern was not printed. In the prior art mask pattern, the pattern size was largely changed depending on a change in focus position, thus generating a resolution failure.

<Embodiment 1>

Figure 1A:
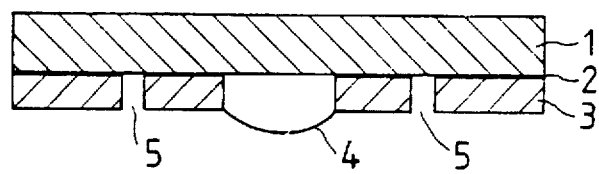
FIG. 1(a) is a sectional view of a photomask in Embodiment 1 of the present invention.
Figure 1B:
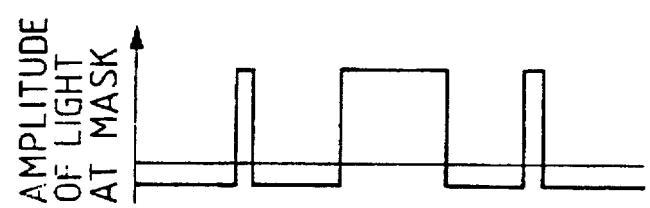
FIG. 1(b) is a view showing the amplitude distribution of a light beam passing through the photomask shown in FIG. 1(a)

A first embodiment of the present invention will be described with reference to FIGS. 1(a) to 1(c). FIG. 1(a) is a sectional view of a photomask of the present invention. The material construction of the mask is the same as in Comparative Example. A semitransparent film 2 made of Cr, and a phase shifter 3 made of spin-on-glass were provided on a glass substrate 1. A positive resist was applied thereon, being patterned by electron beam irradiation and development, and was etched to form a main pattern 4 and an auxiliary pattern 5. The mask thus obtained is different from that of Comparative Example in that the auxiliary pattern 5 is provided. The NA of projection optics was 0.52 and the wavelength of exposure light was 0.365 μm. At this time, the main pattern (projected on a wafer) was formed in a circular shape having a diameter of 0.6 μm and the width of the auxiliary pattern (projected on the wafer) was 0.1 μm. The distance between the main pattern 4 and the auxiliary pattern was 1.1 μm. As shown by the amplitude distribution of passing light in FIG. 1(b), the phase angle of a light beam passing through the auxiliary pattern 5 was set to be the same as that of a light beam passing through the main pattern 4. Additionally, in the following embodiments, the dimensions of patterns are those of the patterns projected on a wafer, so long as being particularly described as those of the patterns depicted on a mask.

Figure 1C:
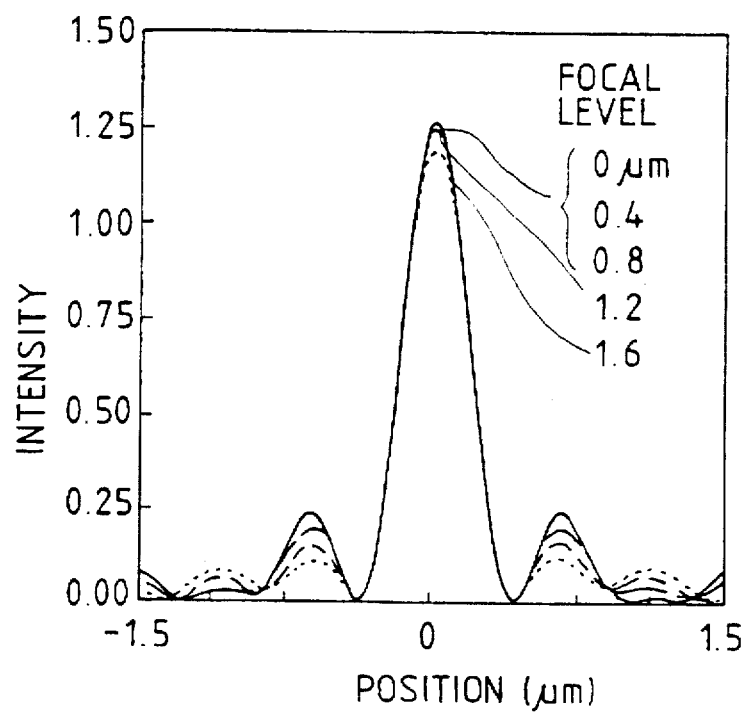
FIG. 1(c) is a view showing the intensity of the light beam passing through the photomask shown in FIG. 1(a)

FIG. 1(c) shows a light intensity distribution obtained using the mask through simulation, wherein the coherence σ of an illuminating system is 0.1 and the out of focus is set at 0, 0.4, 0.8, 1.2, and 1.6 μm. The light intensity distribution in each of the cases where the focus position was shifted by 0.4 and 0.8 μm was the same as that in the case where the out of focus was 0 μm. Even in the case where the focus position was shifted by 1.6 μm, the light intensity distribution was nearly the same as that in the case where the out of focus was 0 μm. Accordingly, it is revealed that the mask in this embodiment can obtain an extremely large depth of focus.

The pattern was actually printed on a resist using this mask. A usual positive resist was applied on a silicon substrate to a thickness of 1 μm and a pattern was printed thereon in a usual manner. The amount of exposure light was set such that the diameter of the resoluble main pattern was 0.3 μm when the out of focus was 0 μm Under the same exposure condition, exposure was performed for the out of focus of 0.8 μm, with a result that the diameter of the resoluble pattern was about 0.3 μm. Even in the case where the focus position was shifted by 16 μm, the hole pattern having a diameter of about 0.28 μm was formed. Thus, in the case of using the mask in this embodiment, an extremely large depth of focus was obtained.

In this embodiment, the halftone phase shift portion was constituted of a double-structure of the semitransparent film and the phase shifter; however, the present invention is not limited thereto. The halftone phase shift portion may be formed of one film capable of realizing the characteristics of the phase inversion and semitransparency. For example, there may be used oxide films and nitride films of Cr, MoSi and WSi, or a nitride film of Si. This is true for the following embodiments.

<Embodiment 2>

Figure 3:
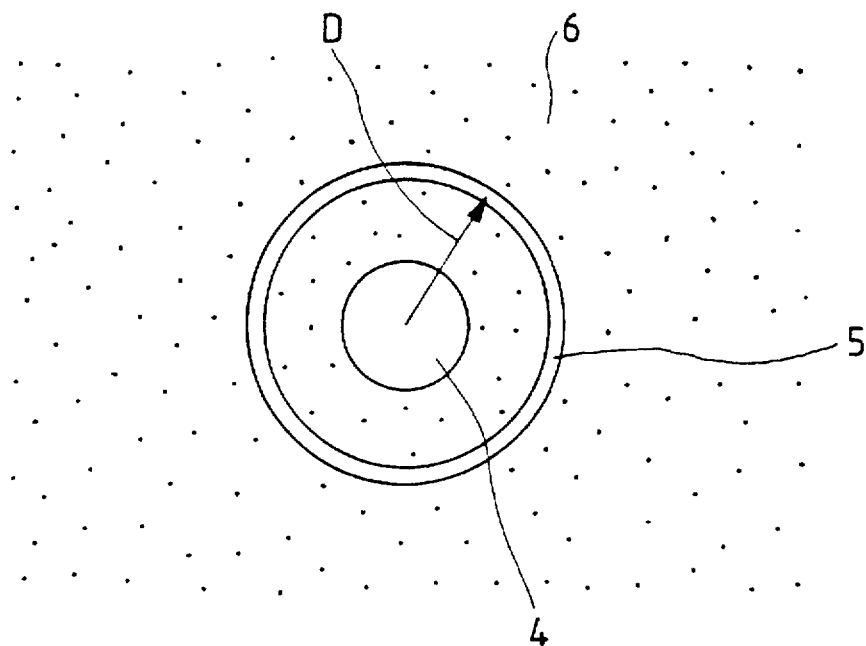
FIG. 3 is a plan view of a photomask in Embodiment 2 of the present invention.
Figure 4:
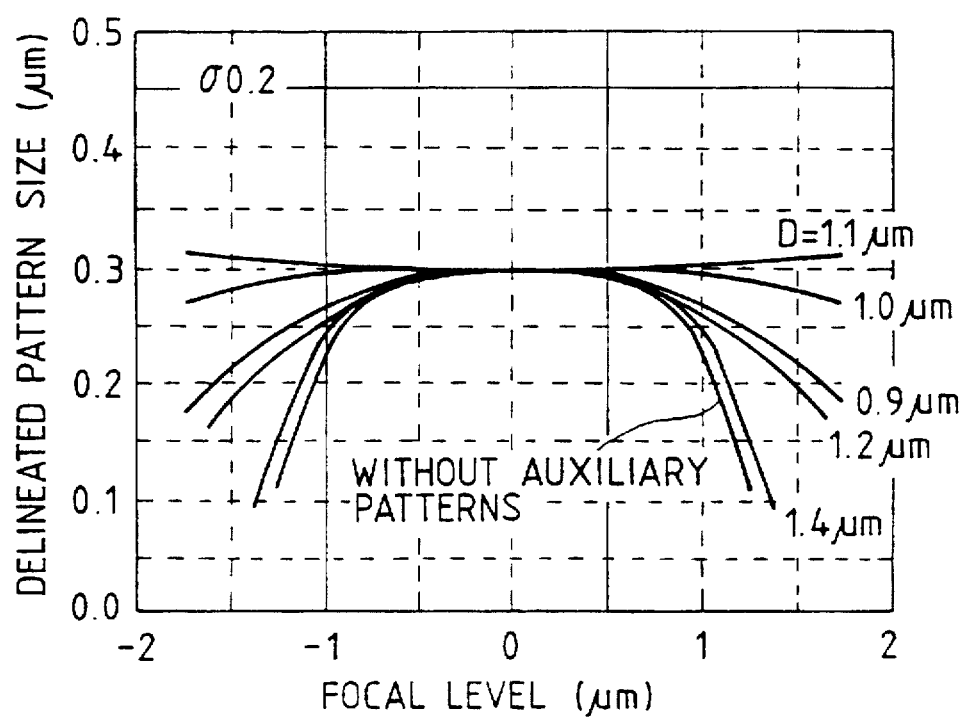
FIG. 4 is a view for illustrating the effect of Embodiment 2 of the present invention.
Figure 5:
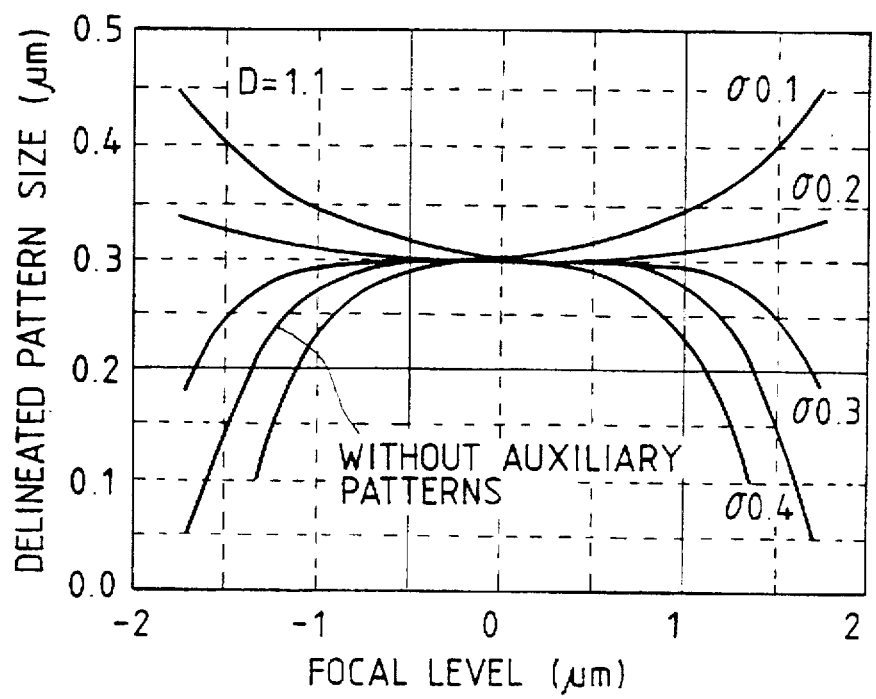
FIG. 5 is a view for illustrating the effect of Embodiment 2 of the present invention.

A second embodiment of the present invention will be described with reference to FIGS. 3, 4 and 5. FIG. 3 is a plan view of a mask used. The material construction of the mask is the same as in Embodiment 1. Reference numeral 6 indicates a semitransparent phase shift portion. The diameter of a main pattern in a transparent portion was 0.5 μm and the width of an auxiliary pattern was 0.1 μm. The mask was prepared by changing the distance D between the center of the main pattern 4 and the center line of the auxiliary pattern 5. The pattern was printed on a positive resist using this mask. The NA of projection optics was 0.52; the wavelength of exposure light was 0.365 μm; and the coherence σ of an illuminating system was 0.2.

The amount of exposure light was set such that the hole diameter of the resist become 0.3 μm when the out of focus was 0 μm. Using each mask having a distance D of 0.9, 1.0, 1.1, 1.2, or 1.4 μm, the pattern was printed while the focus position was changed, and a change in the pattern size was examined. The results are shown in FIG. 4. As is apparent from this figure, the depth of focus is largest when the distance D from the center of the main pattern 4 and the center line of the auxiliary pattern 5 is in the range of from 1.0 to 1.1 μm.

The similar experiments were made using various projection optics being different in NA and λ. As a result, it was revealed that the distance D between the center of the main pattern 4 and the center line of the auxiliary pattern 5 is expressed by the relationship of D=bλ/NA, where NA is a numerical aperture of a projection lens; λ is the wavelength of exposure light; and <b> is a coefficient (=1.49). While other examples are not shown for simplicity of the drawing, on the basis of the values of these examples, the preferable effect of the auxiliary pattern was obtained when the coefficient <b> was in the range of 1.35<b≦1.9.

The above range of b corresponds to the following area in an projected image side. A plurality of sub-peaks exist around the main pattern projected in a state that the focus position is little shifted. Assuming that these peaks are taken as the first sub-peak and second sub-peak from the side near the peak of the main pattern, the position of the first sub-peak corresponds to the coefficient <b> of about 0.9, and the position of the second sub-peak corresponds to the coefficient <b> of about 1.8. Accordingly, the above range of the coefficient <b> corresponds to an area outwardly from an intermediate point between the first sub-peak and the second sub-peak and inwardly from a position slightly outwardly from the second sub-peak.

The coefficient <b> is preferably in the range of 1.35<b≦1.8. This range of the coefficient <b> corresponds to an area outwardly from an intermediate point between the first sub-peak and the second sub-peak and inwardly from the second sub-peak.

The above-described area is on a wafer (on a projected image), and an auxiliary pattern is actually provided in an area of a mask corresponding to the above areas Namely, an auxiliary pattern is preferably provided on a mask at a position satisfying the relationship of D=bλ/NA, where NA is a numerical aperture of a projection lens; and <b> is preferably in the range of 1.35<b≦1.9, and more preferably in the range of 1.35<b≦1.8.

The width of an auxiliary pattern is expressed by the relationship of b'λ/NA (b'λ/NAm on the mask), where <b'> is a coefficient. The coefficient <b'> for forming a preferable pattern was in the range of 0.07≦b'≦0.25. When the width of an auxiliary pattern is large, the auxiliary pattern itself is printed. On the other hand, when it is small, the auxiliary pattern is not effective.

The resolution characteristics of a pattern were examined by changing the coherence of an illuminating system. The results are shown in FIG. 5. The distance D between the center of the main pattern 4 and the center line of the auxiliary pattern 5 was set at 1.1 μm. The coherence σ was changed into 0.1, 0.2, 0.3 and 0.4. In the case of σ=0.4, the depth of focus was reduced as compared with the conventional manner. Accordingly, the coherence a is preferably in the range of σ≦0.3 for achieving the effect of the auxiliary pattern. In the case of σ≦0.2, even when the focus position was shifted, the hole pattern was prevented from being made unclear, that is, the resolution was prevented from being impossible The coherence σ may be set at zero.

<Embodiment 3>

Figure 6:
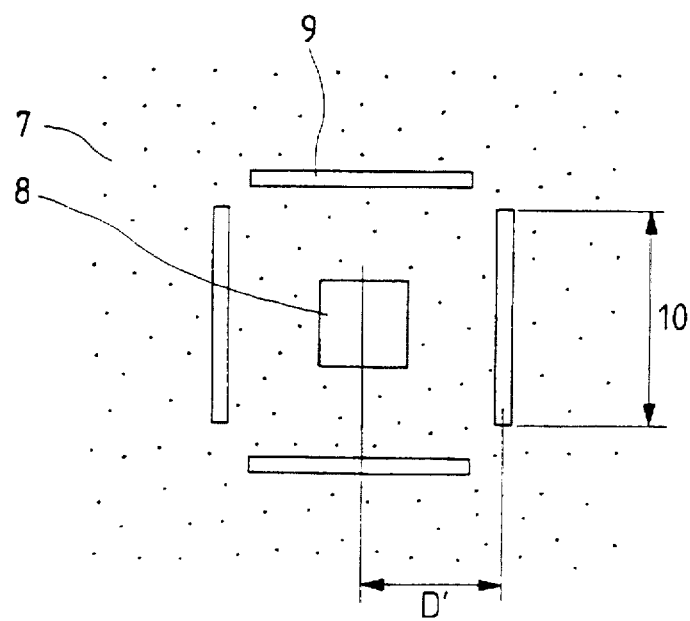
FIG. 6 is a plan view of a photomask in Embodiment 3 of the present invention.

A third embodiment of the present invention will be described with reference to FIG. 6. In this embodiment, the shape of a mask pattern was changed. In Embodiments 1 and 2, a main pattern was formed into a circular shape and the auxiliary pattern was formed in an annular shape; however, in this embodiment, the main pattern and the auxiliary pattern were formed in square shapes. FIG. 6 shows the plane shape of a pattern on a mask. A main pattern 8 was formed in a square shape of 0.5 μm×0.5 μm, and an auxiliary pattern 9 was formed in a rectangular shape having a width of 0.1 μm. A length 10 of the auxiliary pattern was set at 1.5 m. Like Embodiment 2, a pattern was printed by changing a distance D' between the main pattern and the auxiliary pattern. As a result, the same effect as shown in FIG. 4 was obtained The pattern printing was also performed by changing the coherence σ of an illuminating system As a result, the same effect as shown in FIG. 5 was obtained.

The experiment was then performed by changing the length 10 of the auxiliary pattern. As a result, the length 10 of the auxiliary pattern is desirable to be longer than the length of the side of the main pattern 8, and the auxiliary patterns on the upper and lower sides and those on the right and left sides may be respectively connected to each other. However, since the light intensity distribution at the corner portion where the auxiliary patterns are connected to each other is slightly increased, and accordingly, the auxiliary patterns are preferably not contacted with each other at the corner portion. The setting of the distance D' between the center line of the main pattern and the auxiliary pattern is important. The distance D' may be set similarly to the distance D. Namely, on the mask, the distance D' is expressed by the relationship of D'=bλ/NAm, where NAm is a mask-side numerical aperture of a projection lens; λ is the wavelength of exposure light; and the coefficient <b> is in the range of 1.35<b≦1.9. In this embodiment, the distance of the auxiliary pattern is limited as described above; however, the optimum value of the distance is slightly changed depending on the size and shape and transmittance of each of the main pattern and the auxiliary pattern. The shape and the position of the auxiliary pattern, therefore, are required to be optimized in accordance with the main pattern. The auxiliary pattern is not limited to be formed in the rectangular shape, and may be formed in a hole shape. The transmittance of the semitransparent portion is not limited to that described in this embodiment. The structure and the material of the mask are not limited to those described in this embodiment.

<Embodiment 4>

Figure 7:
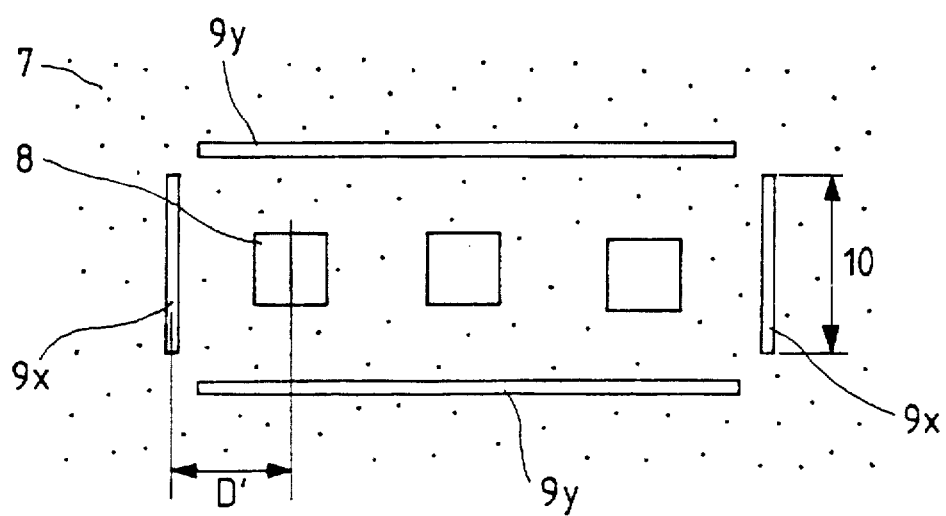
FIG. 7 is a plan view of a photomask in Embodiment 4 of the present invention.

A fourth embodiment of the present invention will be described with reference to FIGS. 7 to 10. In this embodiment, the arrangement of main patterns and auxiliary patterns is changed. FIG. 7 shows an example in which main patterns are arranged in a lateral direction. Three of the main patterns 8 are arranged at a pitch smaller than that being twice a distance D', so that any auxiliary pattern cannot be arranged between the main patterns 8. In such a case, auxiliary patterns 9y and 9x may be arranged along the outer peripheral portion of a main pattern group. The pattern was printed using this mask. As a result, the depth of focus of the main pattern positioned at the center was slightly lowered than those of the main patterns positioned on both the sides; however, as compared with the case with no auxiliary pattern, the depth of focus thereof was improved. In the case of eliminating a difference in the depth of focus therebetween, only the auxiliary patterns 9x may be provided. Namely, even by provision of the auxiliary patterns only along one direction of the main patterns, the effect of improving the depth of focus can be obtained.

Figure 8:
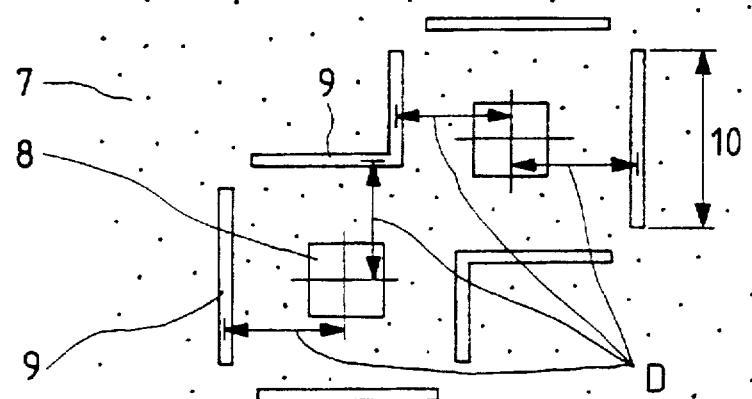
FIG. 8 is a plan view of a photomask in Embodiment 4 of the present invention.

FIG. 8 shows the arrangement of auxiliary patterns in the case where main patterns are arranged along a diagonal line. Each of the auxiliary patterns 9 is located at the position separated from each of the main patterns 8 by a distance D' between the center line of the main pattern 8 and the center of the auxiliary pattern 9. As described above, when an auxiliary pattern for one main pattern is located within the distance D' from another main pattern, it is eliminated. In this case, the auxiliary patterns 9 are sometimes connected in an L-shape, but as described above, they may be separated so as not be contacted with each other at the corner portion.

Figure 9:
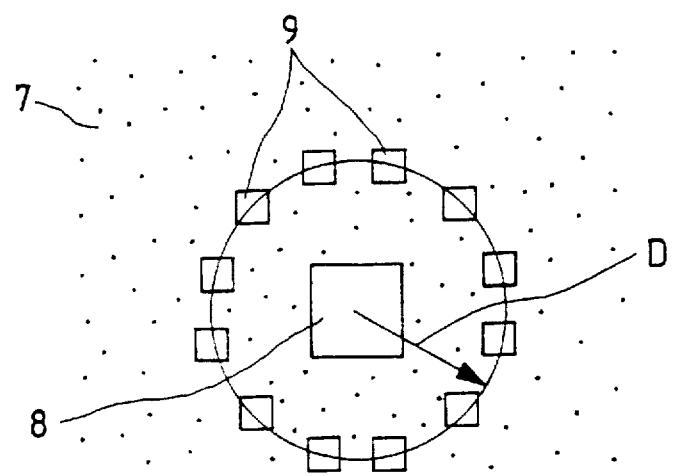
FIG. 9 is a plan view of a photomask in Embodiment 4 of the present invention.

As shown in FIG. 9, square shaped auxiliary patterns each having the same phase angle of light as that of a main pattern 8 may be arranged around the main pattern 8 such that the center of each of the auxiliary patterns 9 is separated from the center of the main pattern 8 by a distance D.

Figure 10:
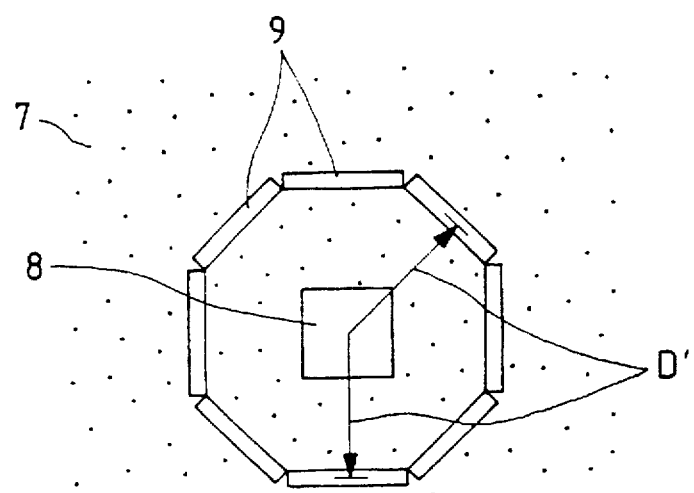
FIG. 10 is a plan view of a photomask in Embodiment 4 of the present invention.

As shown in FIG. 10, slit-shaped auxiliary patterns each having the same phase angle of light as that of a main pattern 8 may be arranged in an octagonal shape such that the center of each of the auxiliary patterns 9 is separated from the center of the main pattern 8 by a distance D. In this way, the object of the present invention can be achieved by arranging transparent auxiliary patterns, each having the same phase angle of light as that of a main pattern, around the main pattern to be projected at the optimum positions.

<Embodiment 5>

Figure 11:
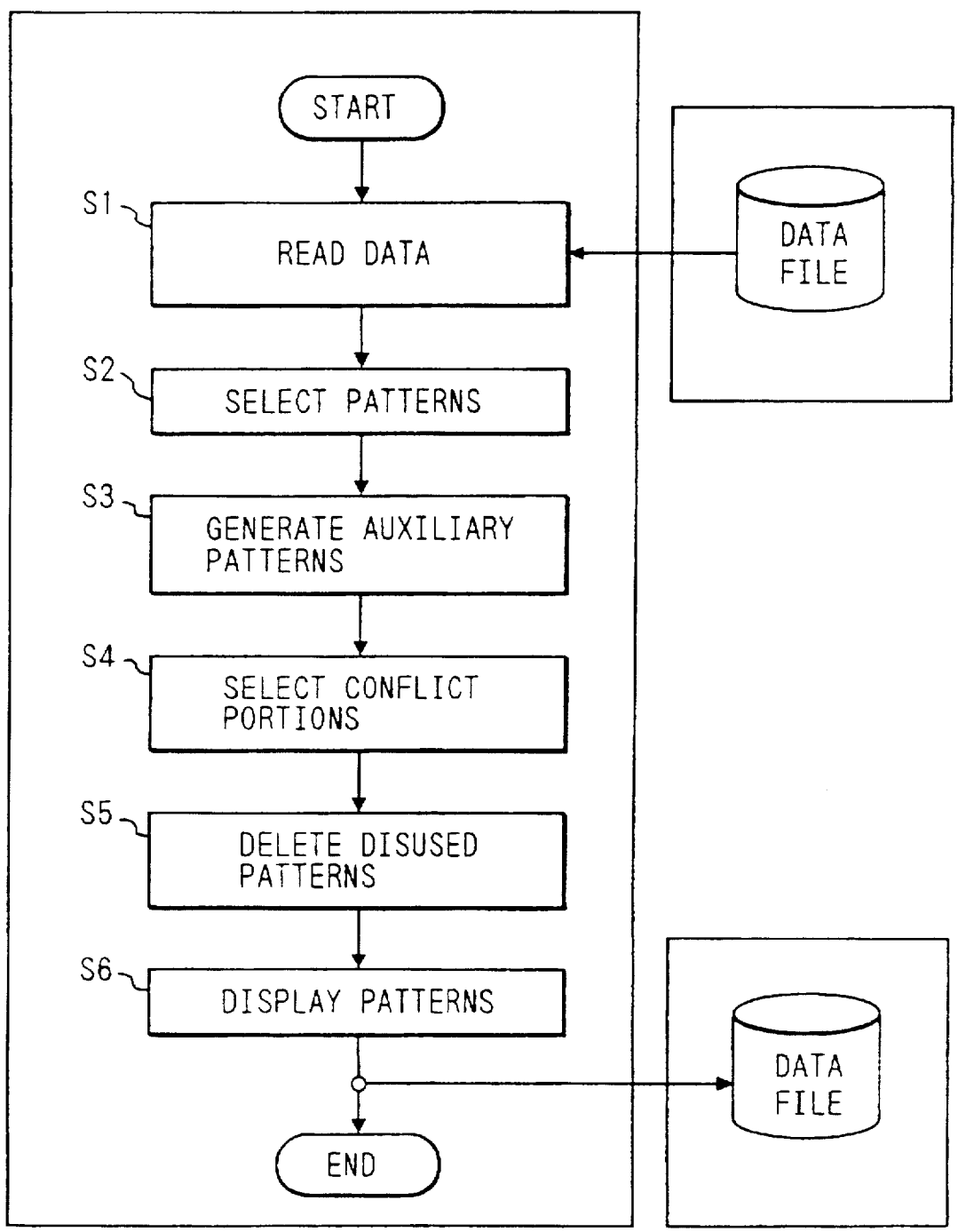
FIG. 11 is a flow chart showing the procedure of Embodiment 5 of the present invention.

In this embodiment, the automatic arrangement of auxiliary patterns was performed by a mask pattern design system including a computer. The procedure of arrangement of auxiliary patterns will be described with reference to FIGS. 11, and 12(a) and 12(b). As shown in FIG. 11, the system used includes an auxiliary pattern automatically producing unit and a data file unit, and it is connected to other function units such as a mask pattern depicting data conversion unit by way of a data file. First, at the step S1, a main pattern to be projected was manually inputted, or it may be inputted from the data file. In an example shown in FIG. 12(a), main patterns 11-1 to 11-7 were arranged.

At the step S2, the patterns requiring auxiliary patterns were selected from those requiring no auxiliary patterns. Since a pattern having a large size has a large depth of focus, the light intensity of the pattern is not affected by the out of focus so much even if any auxiliary pattern is not provided. For this main pattern, any auxiliary pattern is not required to be provided. In the case where the length of the short side of the main pattern is L or less, the auxiliary pattern was provided. L is expressed by the relationship of $L=b_1 \lambda/NA$, where NA is the numeral aperture of a projecting lens; $\lambda$ is the wavelength of exposure light; and $<b_1>$ is a coefficient. The coefficient $<b_1>$ can be predetermined. In the example shown in FIG. 12(b), the main patterns 11-1 to 11-6 are required to be provided with the auxiliary patterns, and the main pattern 11-7 is not required to be provided with any auxiliary pattern. Since the length of the short side of the auxiliary pattern 11-7 is larger than a distance D (described later) between the center of the main pattern and the center of the auxiliary pattern, the suitable position where the auxiliary pattern should be provided is overlapped to the main pattern.

Additionally, in this embodiment, for the main patterns having the sizes and lengths less than the specified values, the auxiliary patterns are provided; however, for the main patterns having the sizes and lengths more than the specified values, auxiliary patterns may be provided in the same manner as described in this embodiment or based on the other manner.

At the step S3, for the main patterns excluding the main pattern 11-7, the shapes and the temporarily disposed positions 12 of auxiliary patterns are determined. In the example shown in FIG. 12(a), since the main patterns are formed in square shapes, rectangular auxiliary patterns are temporarily disposed similarly to the case shown in FIG. 6. The temporarily disposed positions 12 are determined on the basis of the distance D between the center of the main pattern and the center of the auxiliary pattern. The distance D is expressed by the relationship of $D=b_2 \lambda/NAm$, wherein NAm is the mask-side numeral aperture of projection optics;$\lambda$is the wavelength of exposure light; and $<b_2>$ is a coefficient. The coefficient $<b_2>$ is preferably in the range of $1.0 \leq b_2 < 2.0$, and more preferably in the range of $1.35 \leq b_2 1.9$. The width b' of the auxiliary pattern can be previously inputted. For example, the width may be determined on the basis of the relationship of $b' \lambda/NAm$ ($0.07 \leq b' \leq 0.25$) described in Embodiment 2.

The center lines of the square shaped main pattern were taken along the vertical and lateral directions in the figure. For the vertical center line of the main pattern, auxiliary patterns were temporarily disposed on the right and left sides of the main pattern; while for the lateral center line of the main pattern, auxiliary patterns were temporarily on the upper and lower sides of the main pattern. In this embodiment, the arrangement of the auxiliary patterns was performed on the basis of suitable shapes and centers or center lines of the auxiliary patterns previously inputted in the computer. For example, for a square shaped main pattern, the auxiliary patterns may be arranged in the same manner as in this embodiment; for a circular main pattern, as shown in FIG. 3, annular auxiliary patterns may be arranged; and for a square shaped main pattern having a size being a specified value or less, as shown in FIG. 9, auxiliary patterns are arranged so as to be separated from the main pattern by a specified distance. Moreover, for a rectangular pattern, rectangular auxiliary patterns are arranged so as to be separated from the main pattern by a specified distance relative to the center line in the longitudinal direction of the main pattern. Namely, auxiliary pattern are arranged on both the sides of the rectangular main pattern in the longitudinal direction.

Figure 12A:
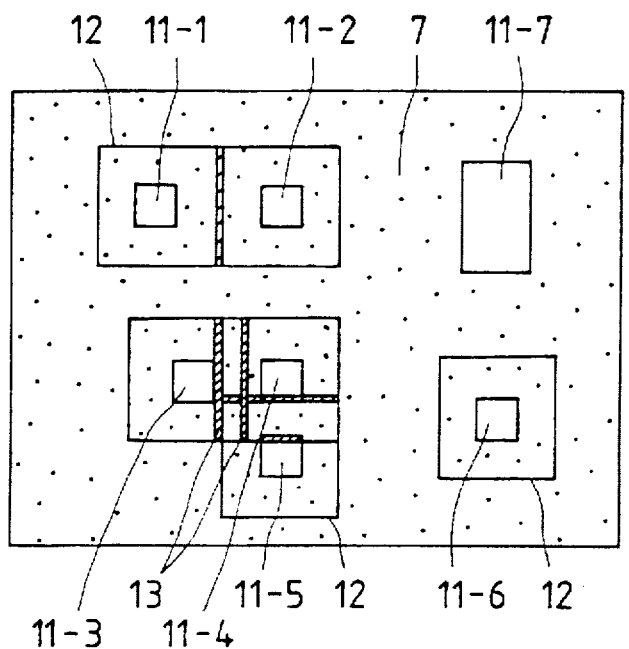
FIG. 12(a) is a plan view of a photomask in Embodiment 5 of the present invention.

At the step S4, a contradiction portion in the arrangement of the auxiliary patterns is judged. Actually, as shown in FIG. 12(a), the main patterns are sometimes arranged to be closed to each other. In this case, the temporarily disposed positions 12 are possibly overlapped to each other or an auxiliary pattern possibly projects in an area separated from the adjacent main pattern by a distance less than the distance D, thus generating a contradiction portion 130 Such a contradiction portion 13 is judged.

At the step S5, the contradiction portion 13 is eliminated. The corner portions between the auxiliary patterns are also eliminated. The width of the corner portion to be eliminated is previously determined, for example, as the magnitude being twice the width of the auxiliary pattern. The corner portion is thus automatically eliminated.

Figure 12B:
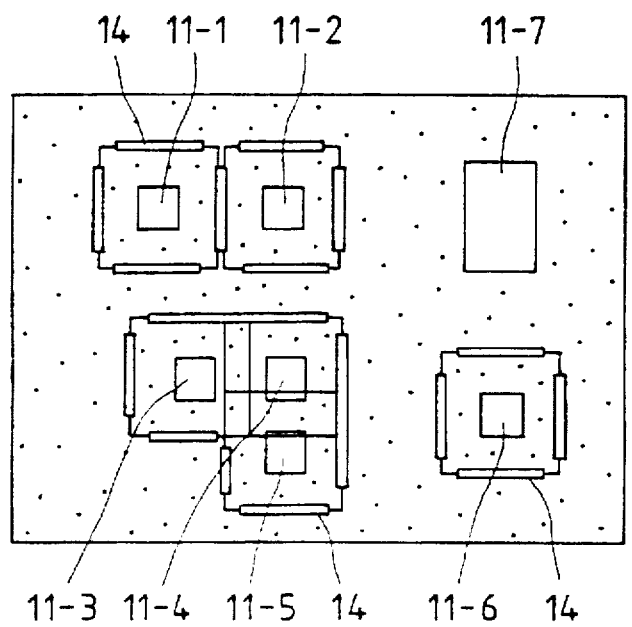
FIG. 12(b) is a plan view of the photomask in Embodiment 5 of the present invention.
Figure 13A:
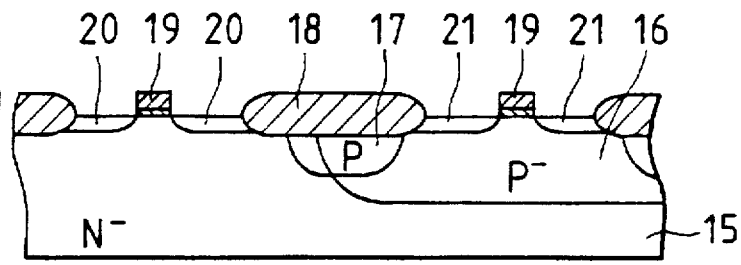
FIGS. 13(a) to 13(d) are diagrams showing processes of manufacturing a semiconductor device in Embodiment 6 of the present invention.
Figure 13B:
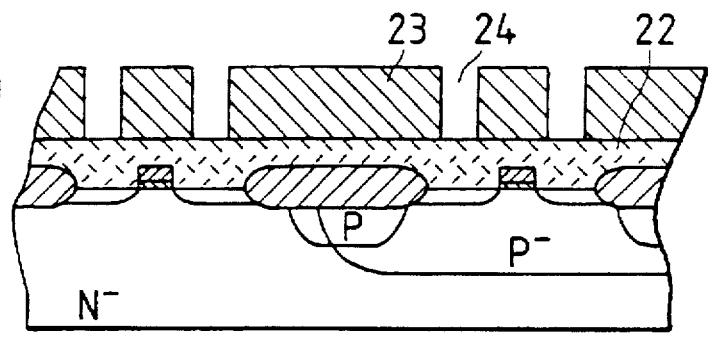
Figure 13C:
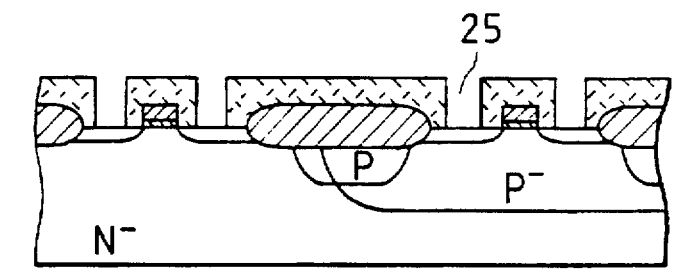
Figure 13D:
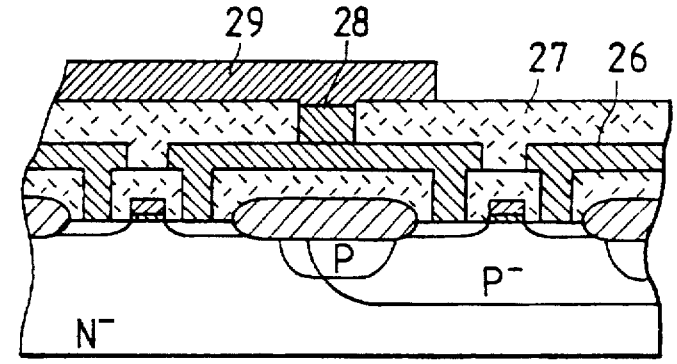

At the step S6, auxiliary patterns 14 are arranged as shown in FIG. 12(b). Thus, the arrangement of the auxiliary patterns 14 is completed. In this example, the rectangular auxiliary pattern is used; however, the present invention is not limited thereto.

The feature of the mask pattern design system lies in that for each main pattern, auxiliary patterns are temporarily arranged, and contradiction portions are extracted and eliminated, thus automatically generating auxiliary patterns only at suitable positions. The extraction of a contradiction portion and the arrangement rule of auxiliary patterns can be freely set.

On the basis of the data thus obtained, a photomask is manufactured by forming each main pattern and the determined auxiliary patterns in the same manner as in Embodiment 1.

<Embodiment 6>

In this embodiment, a semiconductor device was manufactured according to the present invention. FIGS. 13(a) to 13(d) are sectional views of an element showing processes of manufacturing a semiconductor device. A p-type well layer 16, p-type layer 17, field oxide film 18, polycrystalline Si/SiO$_2$ gate 19, p-type highly doped diffusive layer 20, n-type highly doped diffusive layer 21 and the like were formed on an n⁻-type Si substrate 15 in a usual manner (see FIG. 13(a)). An insulating film 22 made of phosphorous glass (PSG) was then coated thereon in a usual manner, and a photoresist 23 was applied on the insulating film 22. Then, a hole pattern 24 was formed by exposure and development using a halftone phase shift mask formed with auxiliary patterns in the same manner as described in Embodiment 5 (see FIG. 13(b)). The insulating film 22 was dry-etched using the photoresist as a mask, to form contact holes 25 (see FIG. 13(c)).

A W/TiN electrode wiring 26 was formed in a usual manner, and then an interlayer insulating film 27 was formed. A photoresist was then applied thereon and a hole pattern 28 was formed using the semitransparent phase shift mask of the present invention. The interior of the hole pattern 28 was buried with a W plug which was connected to an Al made second wiring 29 (see FIG. 13(d)). Thereafter, a passivation process was performed in a usual manner, to manufacture a semiconductor device. In this embodiment, although only the main manufacturing processes have been described, the same processes as the conventional ones were used except that the semitransparent phase shift mask arranged with auxiliary patterns of the present invention was used in the lithography process of forming contact holes.

In this way, a CMOSLSI was manufactured at a high production yield. As a result of manufacturing a semiconductor device using the photomask of the present invention, a resolution failure of a hole pattern due to the lack of focus depth was prevented, and thereby the yield of non-defective products was significantly improved. A large effect was also obtained even when auxiliary patterns were arranged at stepped portions of a substrate, that is, at the positions where the out of focus was large. In addition, it was possible to make fine the pattern, and hence to reduce the area of an element.

<Embodiment 7>

A seventh embodiment of the present invention will be described with reference to FIGS. 14(a), 14(b) and 15. FIG. 14(a) is a plan view of a conventional photomask; and FIG. 14(b) is a plan view of an inventive photomask. Reference numeral 6 indicates a halftone phase shift portion and 4 is a transparent main pattern. FIG. 15 shows light intensity distributions, obtained by simulation, on a pattern projected on a wafer using photomasks shown in FIG. 14(a) and 14(b), which are plotted relative to the positions (A-B) on the mask. The NA of projection optics was 0.52; the wavelength of exposure light was 365 nm; and the coherence σ of a light source was 0.3. In addition, projection optics different from that described in this embodiment may be used.

In FIG. 15, the curve <a> shows the light intensity distribution in the case of using the conventional photomask, and the curve <b> shows the light intensity distribution in the case of using the inventive photomask. In the light intensity distribution in the case of using the conventional photomask shown in FIG. 14(a), a relative light intensity peak of about 0.3 is generated at a point P1.

In the inventive photomask shown in FIG. 14(b), a transparent auxiliary pattern 5 was disposed at the point P1. Specifically, the auxiliary pattern 5 was separated from sides 34 and 35 of the main pattern 4 by a distance D of 0.38 μm (the distance on the mask:magnification of a lens×0.38 μm). The distance D is determined to satisfy the relationship of D=dλ/NA (D=dλ/NAm, on the mask), where NA is the numeral aperture of a projection lens; NAm is the mask-side numeral aperture of the projection lens; λ is the wavelength of exposure light; and <d> is in the range of $0.4 \leq d \leq 0.7$.

The auxiliary pattern 5 was formed in a square-shape and the length I of the side of the auxiliary pattern 5 was 0.3 μm (the length on the mask magnification of lens×0.3 μm); however, it is not limited thereto. The same effect can be obtained when the length I satisfies the relationship of I=iλ/NAm, where NAm is a mask-side numeral aperture of a projection lens; λ is the wavelength of exposure light; and the coefficient <i> is in the range of $0.3 \leq i \leq 0.6$. The shape of the auxiliary pattern is not also limited to the square-shape, and it may be rectangular or circular shape. The same effect can be obtained for the auxiliary patterns being substantially the same in the area.

A pattern was printed on a usual positive resist applied on a substrate using the above-described photomask. The amount of exposure light capable of forming the resist pattern in accordance with the designed dimensions was 240 mJ/cm$^2$. In the case of this amount of exposure light, any unnecessary pattern was not formed even by the use of the conventional photomask. In the case of the amount of exposure light of 280 mJ/cm$^2$ the thinning of the resist film was generated at the position corresponding to the point P1 on the mask. In the case of the amount of exposure light of 300 mJ/cm$^2$, an unnecessary hole pattern was formed at the position corresponding to the point P1. On the contrary in the inventive photomask, any unnecessary pattern was not formed at the position corresponding to the point P1 or other positions even in the case of the amount of exposure light of 300 mJ/cm$^2$.

<Embodiment 8>

An eight embodiment of the present invention will be described with reference to FIGS. 16(a), 16(b) and FIG. 17. FIG. 16(a) is a plan view of a conventional photomask; and FIG. 16(b) is a plan view of an inventive photomask. In each of the cases, two pieces of square-shaped transparent main patterns 4 were disposed in parallel to each other in a halftone phase shift portion 6. The length of the side of the main pattern 4 was 0.5 μm and the distance between the centers of the main patterns 4 was 1.1 μm. The sizes of the patterns and the arrangement thereof are not limited thereto.

FIG. 17 shows a light intensity distribution on a substrate side on which a pattern is projected using the photomask shown in FIGS. 16(a) and 16(b), which is obtained through simulation and is plotted relative to the positions (C-D) on the photomask. The NA of a projection lens was 0.52; the wavelength of exposure light was 365 nm; and the coherence a of a light source was 0.3.

In FIG. 17, the curves <c> and <d> show the light intensity distributions of the conventional photomask and the inventive photomask. In the light intensity distribution of the conventional photomask shown in FIG. 16(a), relative light intensity peaks of about 0.25 are generated at points of P2 and P3. At each of the positions first sub-peak around a main peak of the projected image of one main pattern is overlapped on a first sub-peak around a main peak of the projected image of the other main pattern.

In the inventive photomask shown in FIG. 16(b), transparent auxiliary patterns 5 were disposed at the positions P2 and P3 so as to be separated from the centers of the main patterns 4 by an equal distance S. The distance S was set at 0.65 μm; however, it is not limited thereto. The same effect can be obtained when the distance S satisfies the relationship of $S=s\lambda/NA$, where NA is a numeral aperture of a projection lens; $\lambda$ is the wavelength of exposure light; and the coefficient <s> is in the range of $0.8 \leq s \leq 1.1$ (on the mask, the distance S satisfies the relationship of $S=s\lambda/NAm$, where NAm is a mask-side numeral aperture of a projection lens; $\lambda$ is the wavelength of exposure light; and the coefficient <s> is in the range of $0.8 \leq s \leq 1.1$).

The auxiliary pattern 5 was formed in a square shape and the length I of the side of the auxiliary pattern 5 was 0.2 μm. The length I, however, is not limited thereto. The same effect can be obtained when the length I satisfies the relationship of $I=i\lambda/NA$, where NA is a numeral aperture of a projection lens; $\lambda$ is the wavelength of exposure light; and the coefficient <i> is in the range of $0.2 \leq i \leq 0.5$ (on the mask, the length I satisfies the relationship of $I=i\lambda/NAm$, where NAm is a mask-side numeral aperture of a projection lens; $\lambda$ is the wavelength of exposure light; and the coefficient <i> is in the range of $0.2 \leq i \leq 0.5$). The shape of the auxiliary pattern may be formed in a rectangular or circular shape. The same effect can be obtained for the auxiliary patterns having substantially the same area.

As shown in the curve <d> in FIG. 17 in the light intensity distribution of the inventive photomask, the light intensities at the portions of P2 and P3 are made smaller, that is, the peaks of the conventional photomask disappear.

A pattern was printed on a usual positive resist applied on a substrate using the above-described photomask. The amount of exposure light capable of forming the resist pattern in accordance with the design dimensions was 270 mJ/cm². In the case of this amount of exposure lights any unnecessary pattern was not formed even by the use of the conventional photomask. In the case of the amount of exposure light of 280 mJ/cm², the thinning of the resist film was generated at the positions corresponding to the points P2 and P3 on the mask. Moreover, in the case of the amount of exposure light of 300 mJ/cm², unnecessary hole patterns were formed at the position corresponding to the points P2 and P3. On the contrary, in the inventive photomask, any unnecessary pattern was not formed at the positions corresponding to the points P2, P3 or other positions even in the case of the amount of exposure light of 300 mJ/cm².

In this embodiment, the arrangement of patterns using a halftone phase shift mask has been described. When a light beam diffracted through a transparent main pattern portion is overlapped on a light beam passing through a semitransparent portion at the same phase angle of light, a light intensity peak (sub-peak) is generated. When sub-peaks generated by light beams diffracted through a plurality of transparent main pattern portions are overlapped, a stronger light intensity peak is generated. The auxiliary pattern is disposed to cancel the stronger light intensity peak.

Although a plurality of sub-peaks are generated, a first sub-peak nearest the peak of the main pattern is largest in the light intensity The first sub-peaks of a plurality of the main patterns are overlapped, and accordingly, an auxiliary pattern may be disposed to cancel the light intensity at such a position.

<Embodiment 9>

Figure 18:
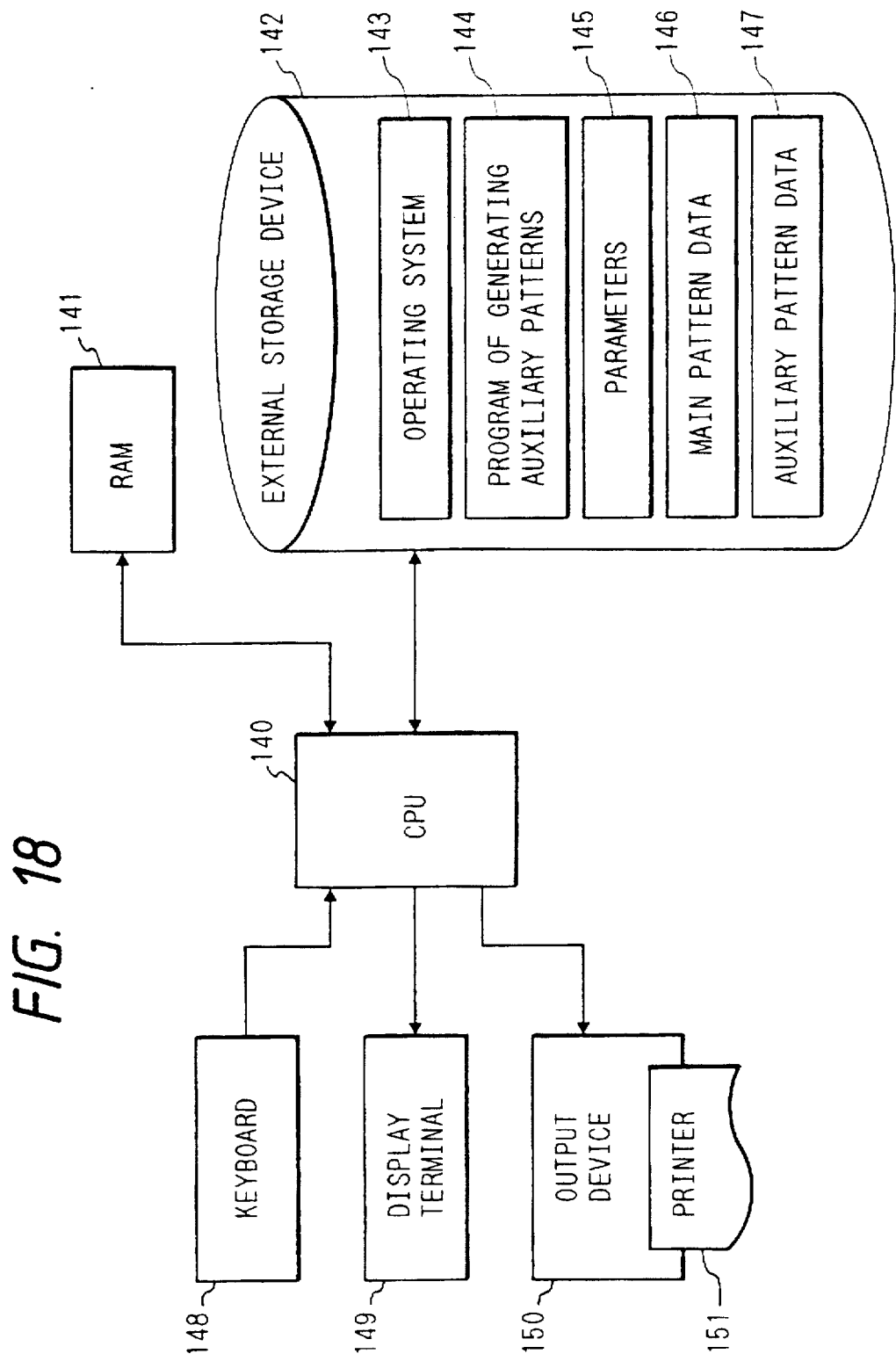
FIG. 18 is a block diagram showing the construction of a mask pattern design system used for the present invention.

FIG. 18 is a block diagram showing the construction of a mask pattern design system used in the present invention. The mask pattern design system includes a CPU 140, RAM 141, memory 142, keyboard 148, display 149, and output device 150 such as printer 1510 The memory 142 includes an operating system storage area 143, auxiliary pattern generating program storage area 144, each parameter storage area 145, inputted main pattern storage area 146, and auxiliary pattern storage area 147.

The RAM 141 includes an area for temporarily storing each parameter and main pattern read from the memory 142, a working area for performing calculation necessary for determining an auxiliary pattern, and an area for temporarily storing the determined auxiliary pattern.

Various commands for the CPU 140 are made by the keyboard 148. The display 149 displays graphic forms such as a main pattern and the determined auxiliary pattern, a menu screen necessary for giving command to the CPU 140, an indicated drawing and the like. Various data are outputted from the output device 150, as needed.

Figure 19:
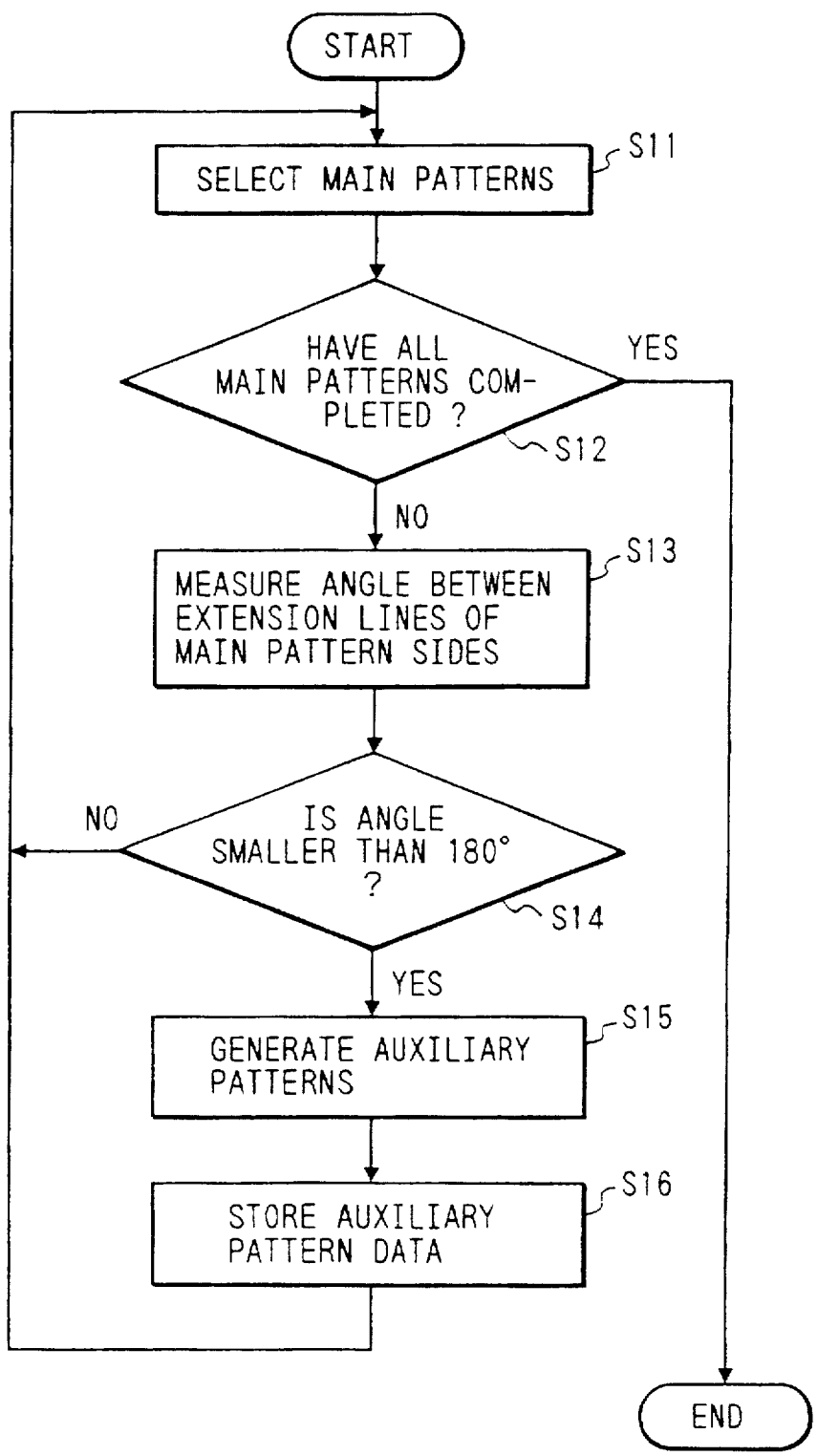
FIG. 19 is a flow chart showing one example of operation of the system shown in FIG. 18.

FIG. 19 is a flow chart showing one example of operations of the mask pattern design system shown in FIG. 18. The operations of this system will be described in detail with reference to the flow chart.

First, one main pattern is selected on the basis of data of main patterns (step S11). When the main pattern is selected, an angle formed by the intersections of the sides or the extension lines thereof is measured (step S13). It is detected whether or not an area in which the angle formed by the intersections is smaller than 180° or less in the area of a semitransparent portion, that is, in the area outside the main pattern, is present (step S14). When the area having the angle less than 180° is not detected, the process is returned to the step S11, in which another main pattern is selected again. When the main pattern to be selected is not detected, that is, when all of the main patterns are selected, the process is completed (step S12).

When an area having an angle less than 180° or less is detected at the step S13, the data of auxiliary patterns are determined such that the auxiliary pattern is disposed at a position separated from the two sides outside the area by specified distances (step S15). The data of the auxiliary pattern is stored (step S16). The process is then returned to the step S11, to select the next main pattern.

On the basis of the data of the main pattern and the auxiliary pattern, main patterns and an auxiliary patterns are formed on a photomask similarly to Embodiment 1.

Next, a semiconductor device was manufactured using the photomask formed with the main patterns and auxiliary patterns in the same manner as in Embodiment 6. As described in this embodiment, it becomes possible to arrange auxiliary patterns using the mask pattern design system, to prepare a photomask on the basis of the data thus obtained, and to manufacture a semiconductor device using the photomask.

<Embodiment 10>

Figure 20:
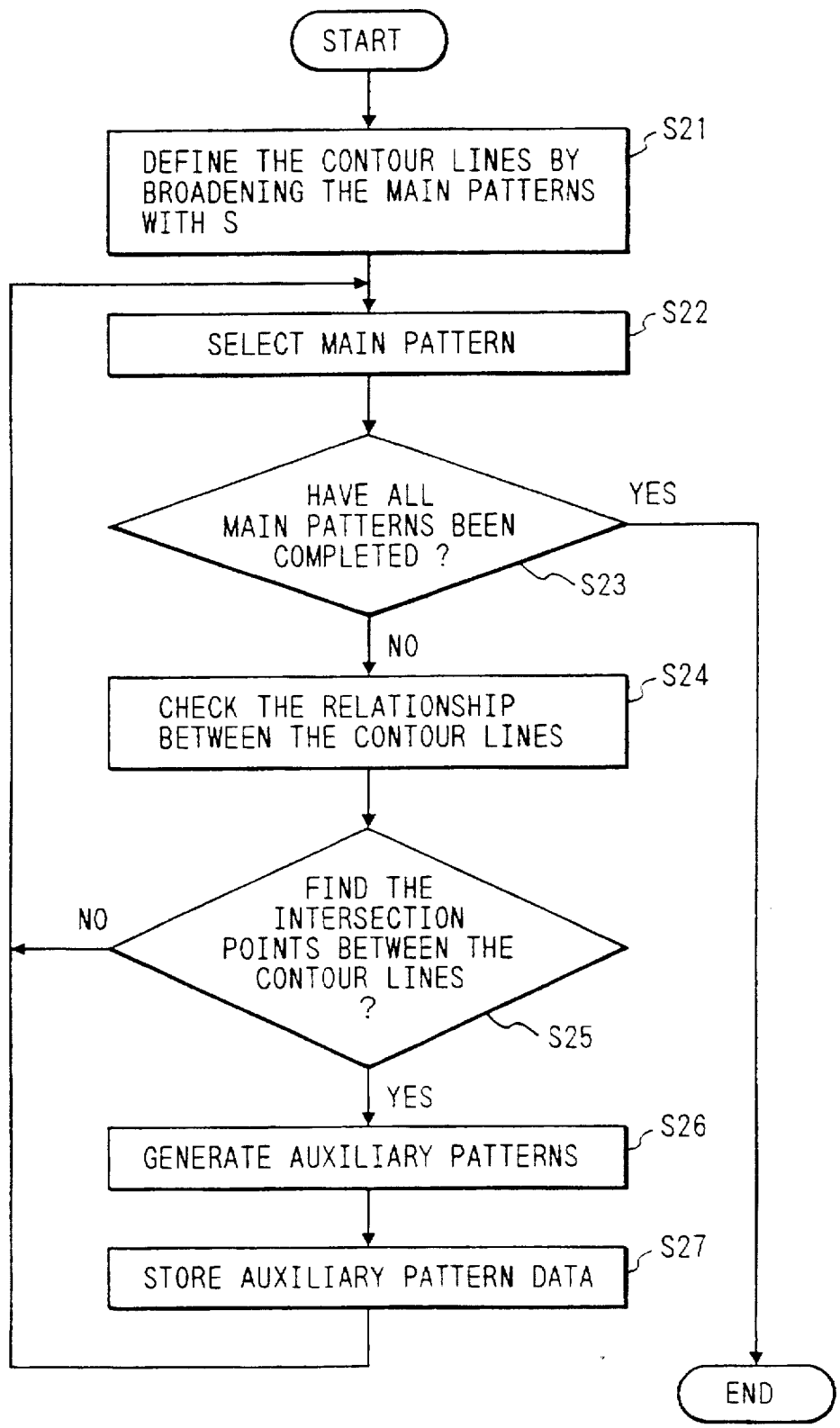
FIG. 20 is a flow chart showing another example of operations of the system shown in FIG. 18.

FIG. 20 is a flow chart showing an another example of operations of the mask pattern design system shown in FIG. 18. The another example of operations of the system will be described in detail with reference to the flow chart.

First, a contour line separated from each main pattern by a distance S is calculated on the basis of data of each main pattern and parameters of projection optics (step S21) The distance S is selected to satisfy the relationship of S=sλ/NAm, where NAm is a mask-side numeral aperture of a projection lens;λ is the wavelength of exposure light; and the coefficient <s> is in the range of from $0.8 \leq s \leq 1.1$. After a main pattern is selected (step S22), a position where the contour line of the main pattern is close to or crossed to that of either of other main patterns is detected (step S24). Then, it is examined whether or not the position is located on either of other main patterns. When the position is located on either of other main patterns, it is eliminated. And, when a position of an equal distance S from the two main patterns is absent or such a position is eliminated, the process is returned to the step S22, in which the next pattern is selected. When the main pattern to be selected is not present, that is, all of the main patterns are selected, the process is completed (step S23).

When it is judged at the step S25 that the position of the equal distance S from the two main patterns is present, the data of auxiliary patterns are determined such that an auxiliary pattern having a specified shape is disposed at the position (step S26) The data of the auxiliary pattern is stored (step S27), and the process is returned again to the step S22 to select the next main pattern.

On the basis of the data of the main patterns and the auxiliary patterns, main patterns and auxiliary patterns are formed on a photomask in the same manner as in Embodiment 1. Next, a semiconductor device was manufactured using the photomask formed with the main patterns and the auxiliary patterns in the same manner as in Embodiment 6.
<Embodiment 11>

Figure 21:
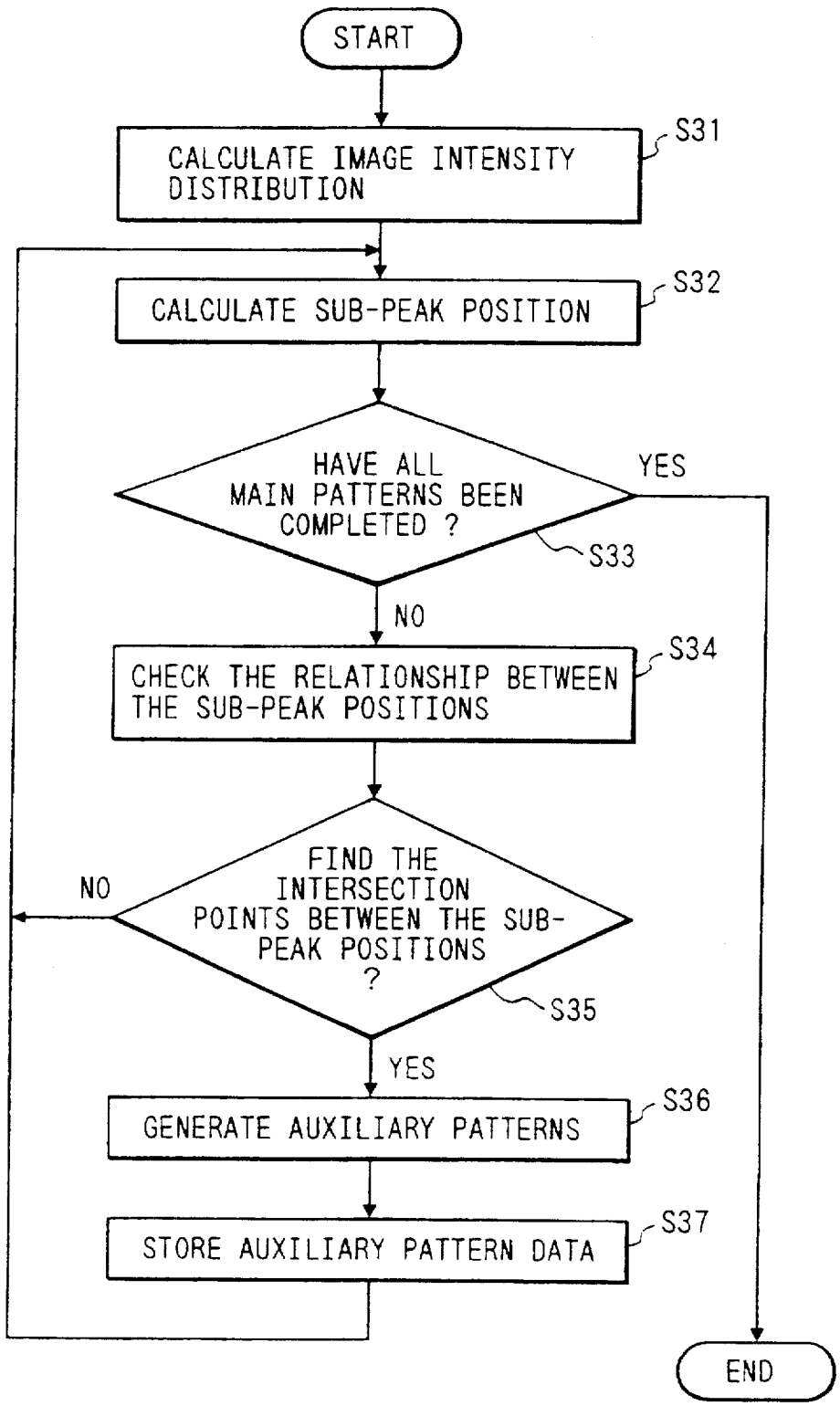
FIG. 21 is a flow chart showing a further example of operations of the system shown in FIG. 18.

FIG. 21 is a flow chart showing a further example of operations of the mask pattern design system shown in FIG. 18 The further example of operations of the system will be described in detail with reference to the flow charts.

A light intensity distribution of the projected image of each main pattern is first calculated on the basis of the data of each main pattern and parameters of projection optics (step S31). One of the first sub-peaks in the light intensity distributions is selected (step S32). A position where the first sub-peak for one main pattern is overlapped on a first sub-peak for another main pattern is detected (step S34). When the overlapping position is not detected, the process is returned again to the step S32, in which a first sub-peak for a further main pattern is selected (step S35). When any main pattern to be selected is not present, that is, all of the main patterns are already selected, the process is completed (step S33).

When the position where two of the first sub-peaks are overlapped to each other is present at the step S34, the data of auxiliary patterns are determined such that an auxiliary pattern is disposed at such a position (step S36).The data of the auxiliary pattern is stored (step S37), and the process is returned again to the step S32, in which the next first sub-peak is selected.

On the basis of the data of the main patterns and the auxiliary patterns, main patterns and auxiliary patterns are formed on a photomask in the same manner as in Embodiment 1. Next, a semiconductor device was manufactured using the photomask formed with the main patterns and the auxiliary patterns in the same manner as in Embodiment 6.
<Embodiment 12>

Figure 22:
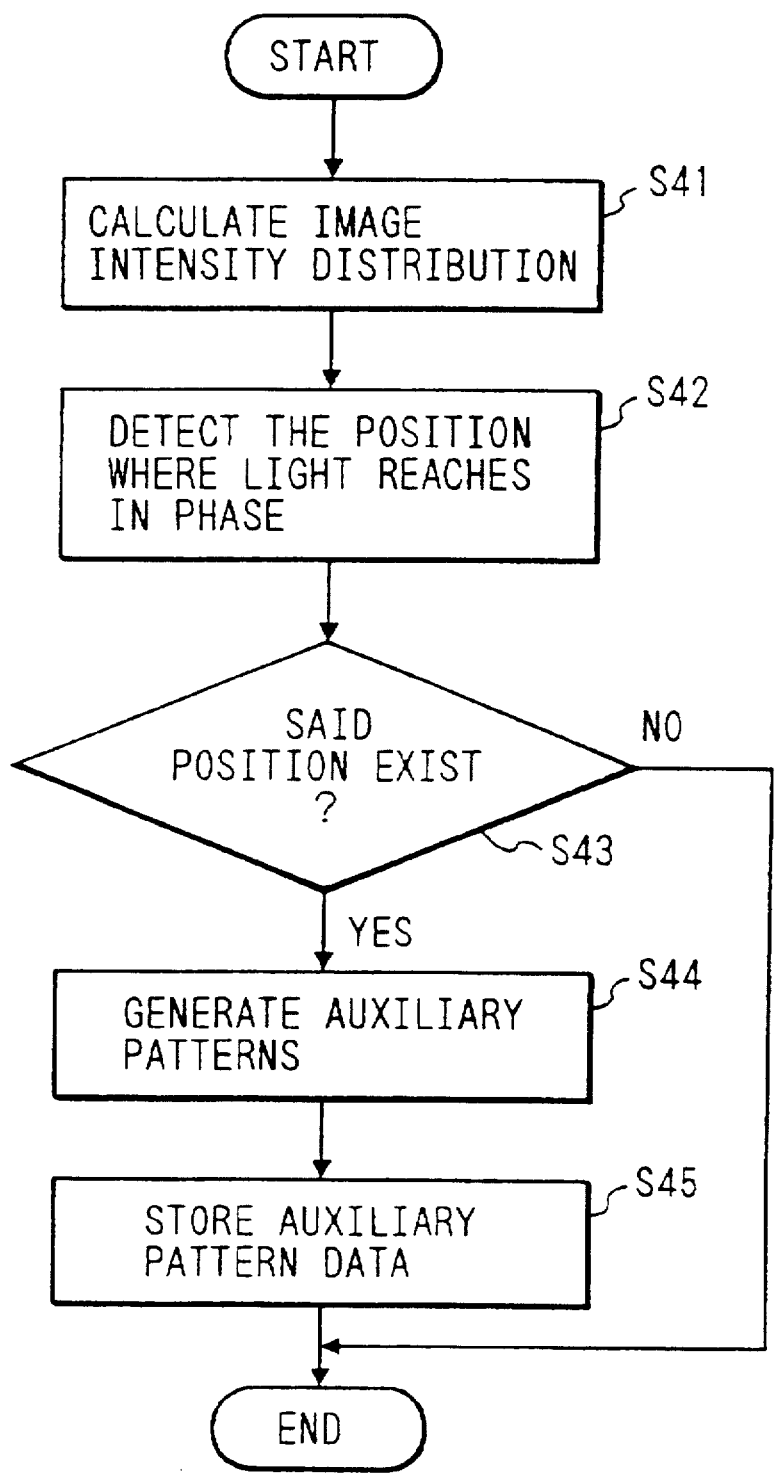
FIG. 22 is a flow chart showing still a further example of operations of the system shown in FIG. 18.

FIG. 22 is a flow chart showing still a further example of operations of the mask pattern design system shown in FIG. 18. The further example of operations of the system will be described in detail with reference to the flow chart.

A diffraction light beam from each main pattern is first calculated on the basis of the data of main patterns and parameters of projection optics (step S41), and a position where the diffraction light beams are overlapped at the same phase angle of light is detected (step S42). When such a position is detected (step S43), the data of auxiliary patterns are determined such that an auxiliary pattern having a size being a resolution limit or less is disposed at a position of the photomask corresponding the above position (step S44). The data of the auxiliary pattern is stored (step S45).

On the basis of the data of the main patterns and the auxiliary patterns, main patterns and auxiliary patterns are formed on a photomask in the same manner as in Embodiment 1. Next, a semiconductor device was manufactured using the photomask formed with the main patterns and the auxiliary patterns in the same manner as in Embodiment 6.

According to the inventive photomask, the generation of an unnecessary light intensity peak due to the arrangement of main patterns, which has been regarded as a disadvantage of the conventional photomask, was eliminated and thereby the printing of any unnecessary pattern was avoided. This makes it possible to increase the amount of exposure light enabling the printing of only a main pattern. In other words, a failure of printing an unnecessary pattern can be prevented. As a result of manufacturing a semiconductor device using such a photomask, it was possible to make fine patterns and hence to reduce the area of an element.
<Embodiment 13>

Figure 23:
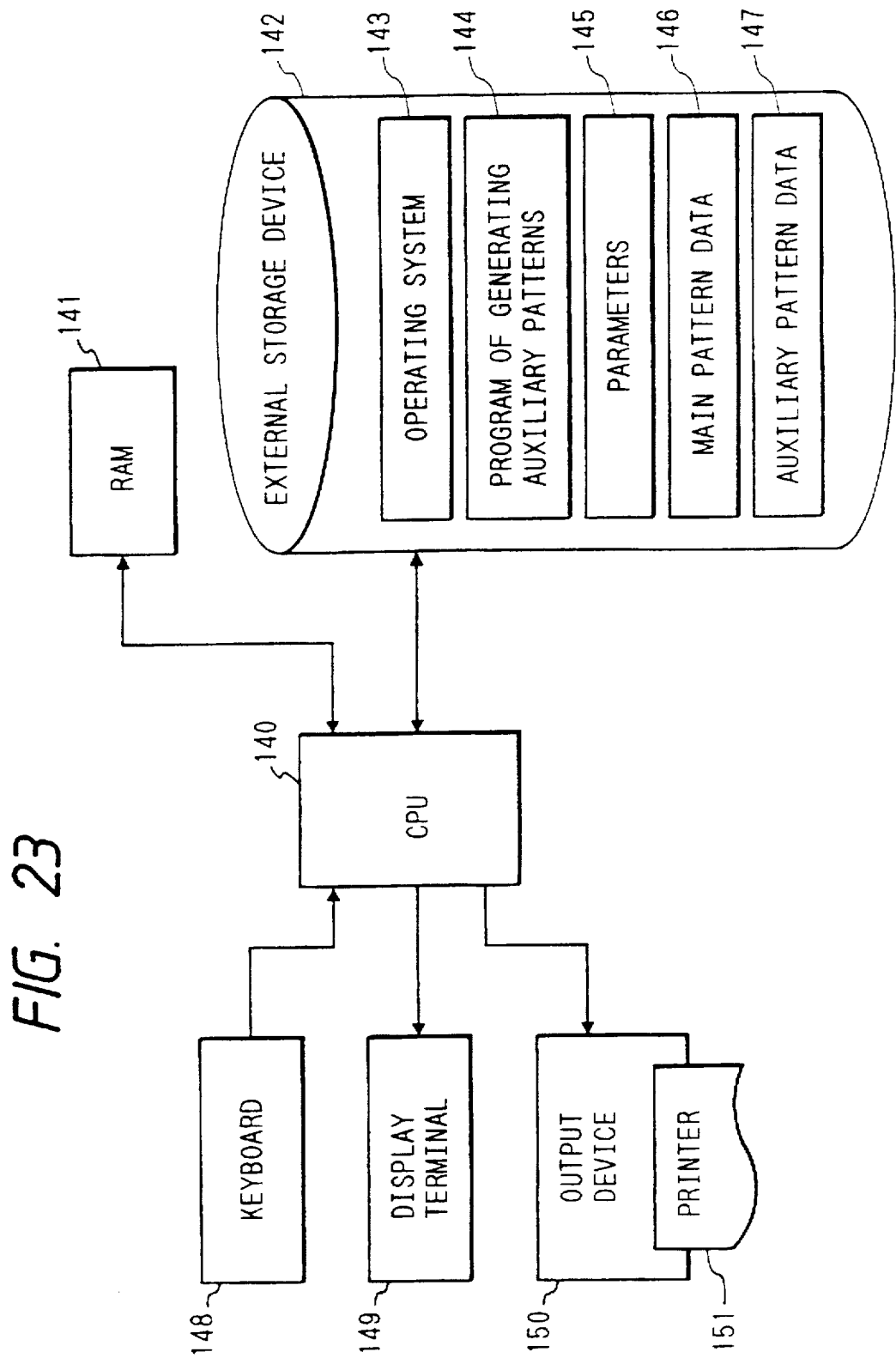
FIG. 23 is a block diagram showing the construction of a mask pattern design system in Embodiment 13 of the present invention.

FIG. 23 is a block diagram showing the construction of a mask pattern design system used in the present invention. The mask pattern design system includes a CPU 140, RAM 141, memory 142, keyboard 148, display 149, and output device 150 such as printer 1510 The memory 142 includes an operating system storage area 143, auxiliary pattern generating program storage area 144, each parameter storage area 145, inputted main pattern storage area 146, and auxiliary pattern storage area 147.

The RAM 141 includes an area for temporarily storing each parameter and main pattern read from the memory 142, a working area performing calculation necessary for determining an auxiliary pattern, and an area for temporarily storing the determined auxiliary pattern.

Various commands for the CPU 140 are made by the keyboard 148. The display 149 indicates graphic forms of a main pattern and the determined auxiliary pattern, a menu screen for giving command to the CPU 140 and an indicating drawing. Various data are outputted from the output device 150, as needed.

Figure 24:
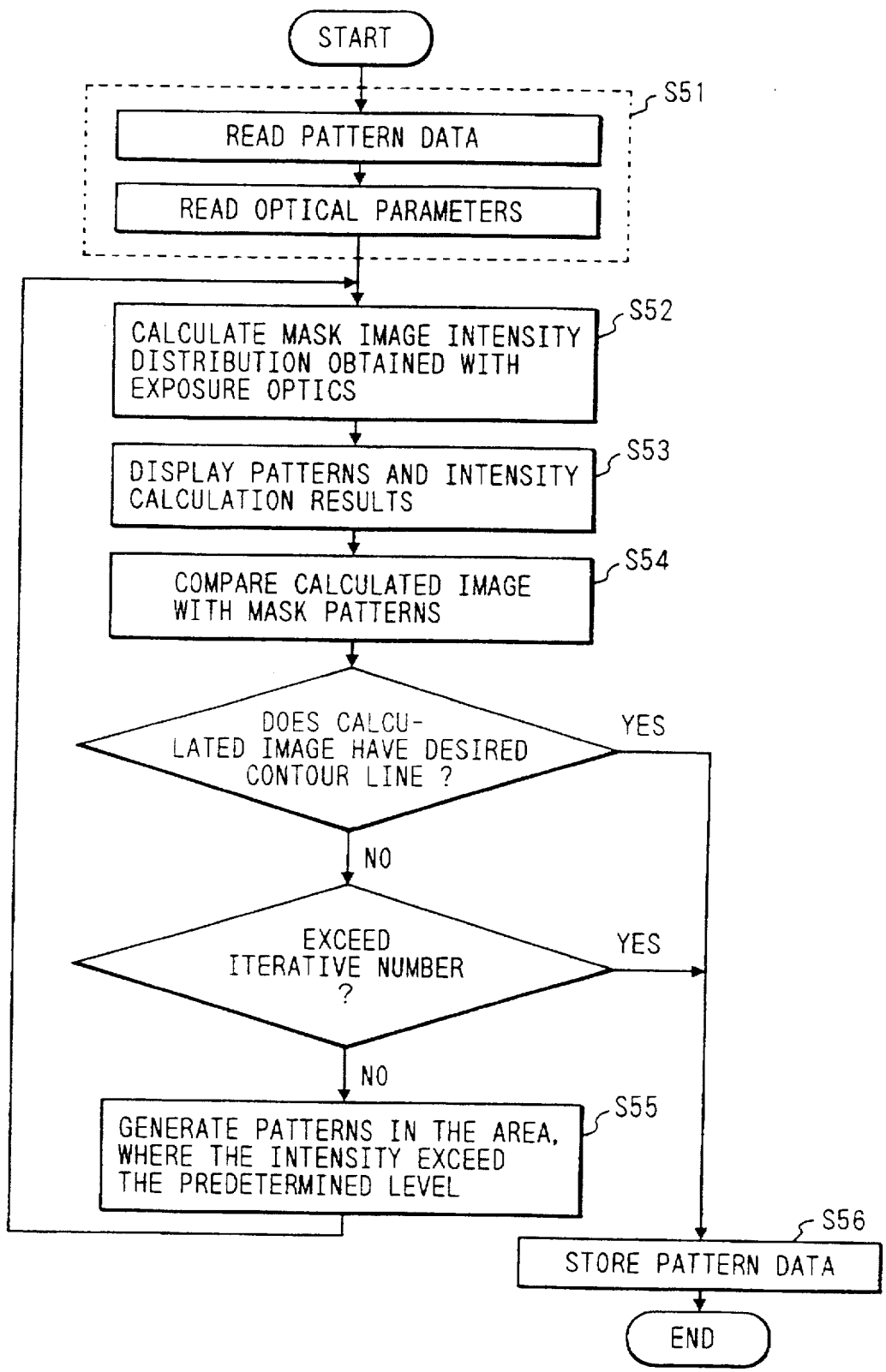
FIG. 24 is a flow chart showing one example of operations of the system shown in FIG. 23.

FIG. 24 is a flow chart showing one example of operations of the mask pattern design system shown in FIG. 23. The operations of this system will be described in detail with reference to the flow chart.

At the step 51, data of main patterns of a halftone phase shift mask and parameters of projection optics for printing the mask pattern on a substrate to be exposed are read. The parameters of the projection optics contain a numeral aperture of a projection lens (NA), mask-side numeral aperture of a projecting lens (NAm), wavelength λ of light used for printing, and a parameter σ indicating the degree of coherence.

At the step 52, a light intensity distribution of a projected image of the main pattern is calculated. The light intensity distribution of a projected image and the projected pattern on a wafer corresponding to the main pattern on the mask are indicated at the step 53. The display is suitably selected to indicate the whole or partial portion. Simultaneously, at the step 54, the main pattern is compared with the calculated projected image in the shape. Here, the shape of the projected image means a contour line obtained by slicing the light intensity distribution at a specified intensity level. As a result of the comparison, when a difference therebetween is less than an allowable value, the design is completed. However, when the difference is more than the allowable value, that is, the side robe is emphasized and an unnecessary pattern is formed, an auxiliary pattern is provided at the step 55. The size of the auxiliary pattern was set at 0.25 λ/NA. The projected image is calculated again, and is compared with the input mask pattern. To lower the difference therebetween, the arrangement of an auxiliary pattern and the calculation of the projected image may be repeated by several times. However, a specified ending number may be inputted for preventing the indefinite loop.

Figure 25:
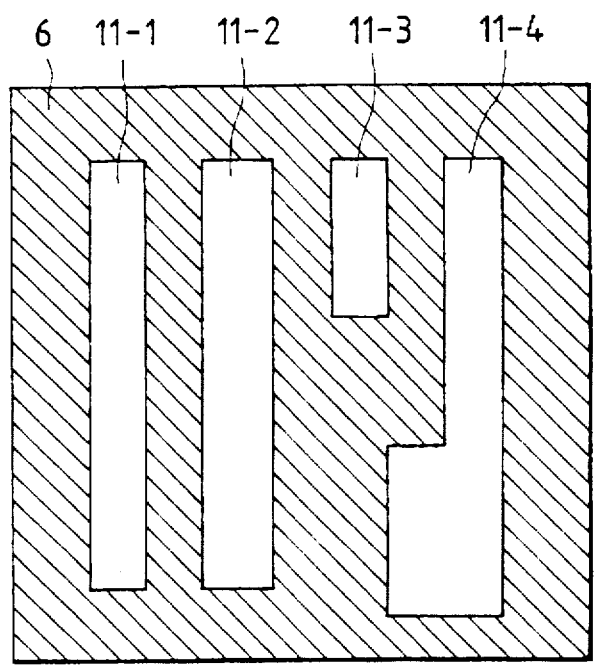
FIG. 25 is a plan view of a photomask used in Embodiment 13 of the present invention.
Figure 26:
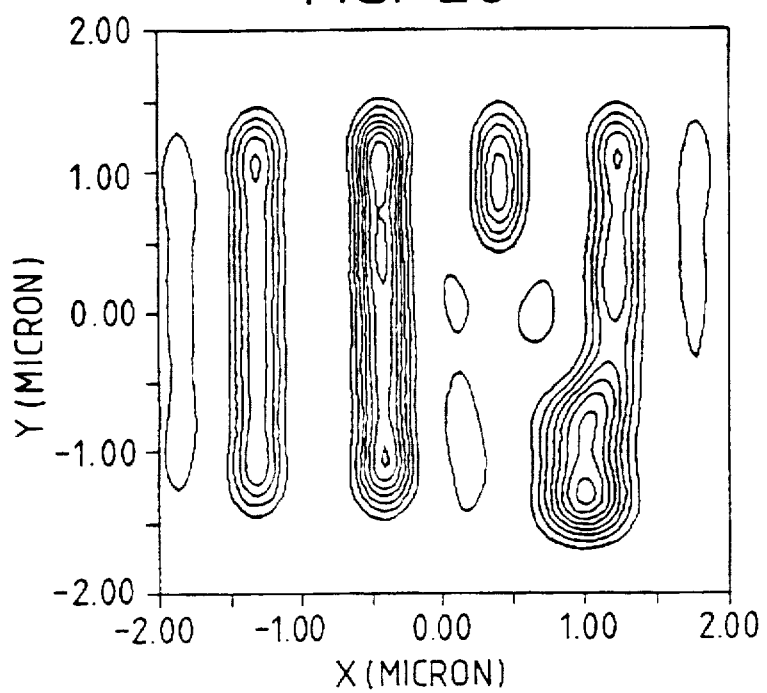
FIG. 26 is a view showing a light intensity distribution of a light beam passing through the photomask shown in FIG. 25.
Figure 27:
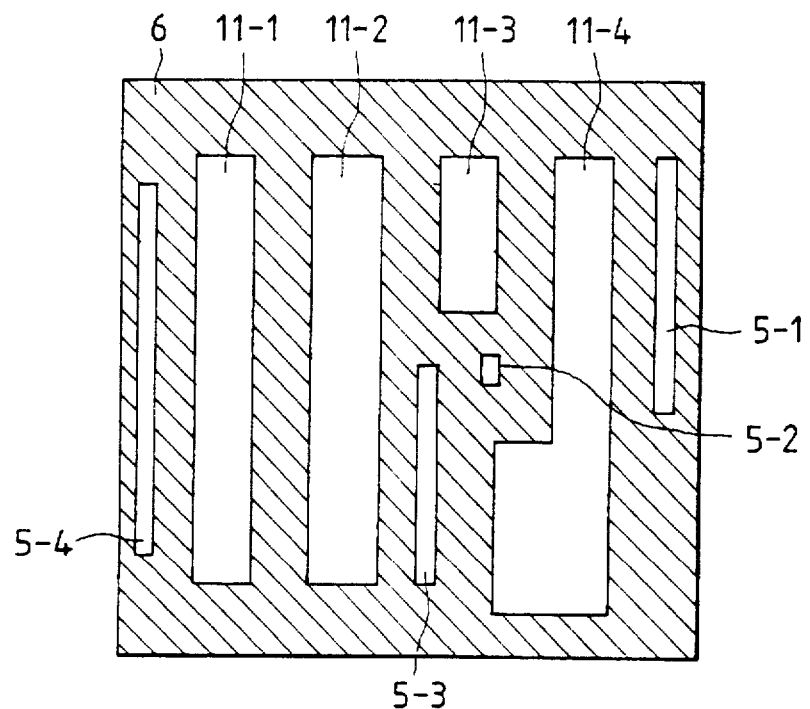
FIG. 27 is a plan view of a photomask in Embodiment 13 of the present invention.
Figure 28:
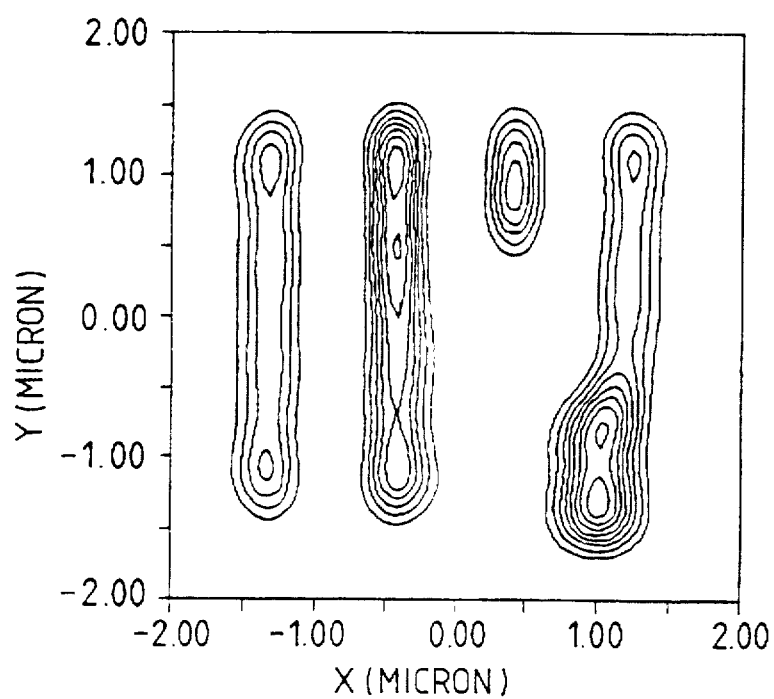
FIG. 28 is a view showing a light intensity distribution of a light beam passing through the photomask shown in FIG. 27.

FIG. 25 shows an example of an input pattern of a halftone phase shift. Main patterns 11-1, 11-2, 11-3 and 11-4 are arranged in a halftone phase shift portion 6. An image obtained by printing the mask using a projection exposure system (λ=0.365 μm, NA=0.5, σ=0.3) was calculated. The results are shown in FIG. 26, in which the emphasized side robes are generated. As shown in FIG. 27, at portions of the mask corresponding to the portions where the side robes are generated, auxiliary patterns 5-1, 5-2, 5-3 and 5-4 were formed (width of the auxiliary patterns 0.15 μm on the wafer). As shown in FIG. 28, a preferable projected image of the pattern was obtained. At the step 56, the mask pattern thus obtained was stored as the pattern data.

<Embodiment 14>

FIG. 40 is a block diagram showing another example of operations of the mask pattern design system described in Example 13. The data of main patterns stored in a file 121 are read out by an input data reading means 122, and are stored in a file 128. A projected image light intensity calculating means 123 calculates a projected image predicted from the input data, and the result thereof is stored in a file 129. A comparing means 125 compares the data stored in the file 128 with those stored in the file 129. In this case, the data are simultaneously or sequentially displayed on a display means 124. When the difference between the data stored in the files 128 and 129 is large, an auxiliary pattern is generated by a pattern generating means 126 and is given to the main pattern, and is stored in the file 128 again. When the difference between the data stored in the files 128 and 129 is within an allowable value, a storing means 127 outputs the data stored in the file 128 as the finally obtained photomask data into a file 130.

In addition, by simultaneously or sequentially displaying a group of the inputted patterns and newly generated patterns or the results of calculation of the projected image, the operational performance of the system could be enhanced.

According to this embodiment, it is possible to accurately obtain the position of an auxiliary pattern even in the case where the arrangement and shape of patterns are complicated.

<Embodiment 15>

Figure 29:
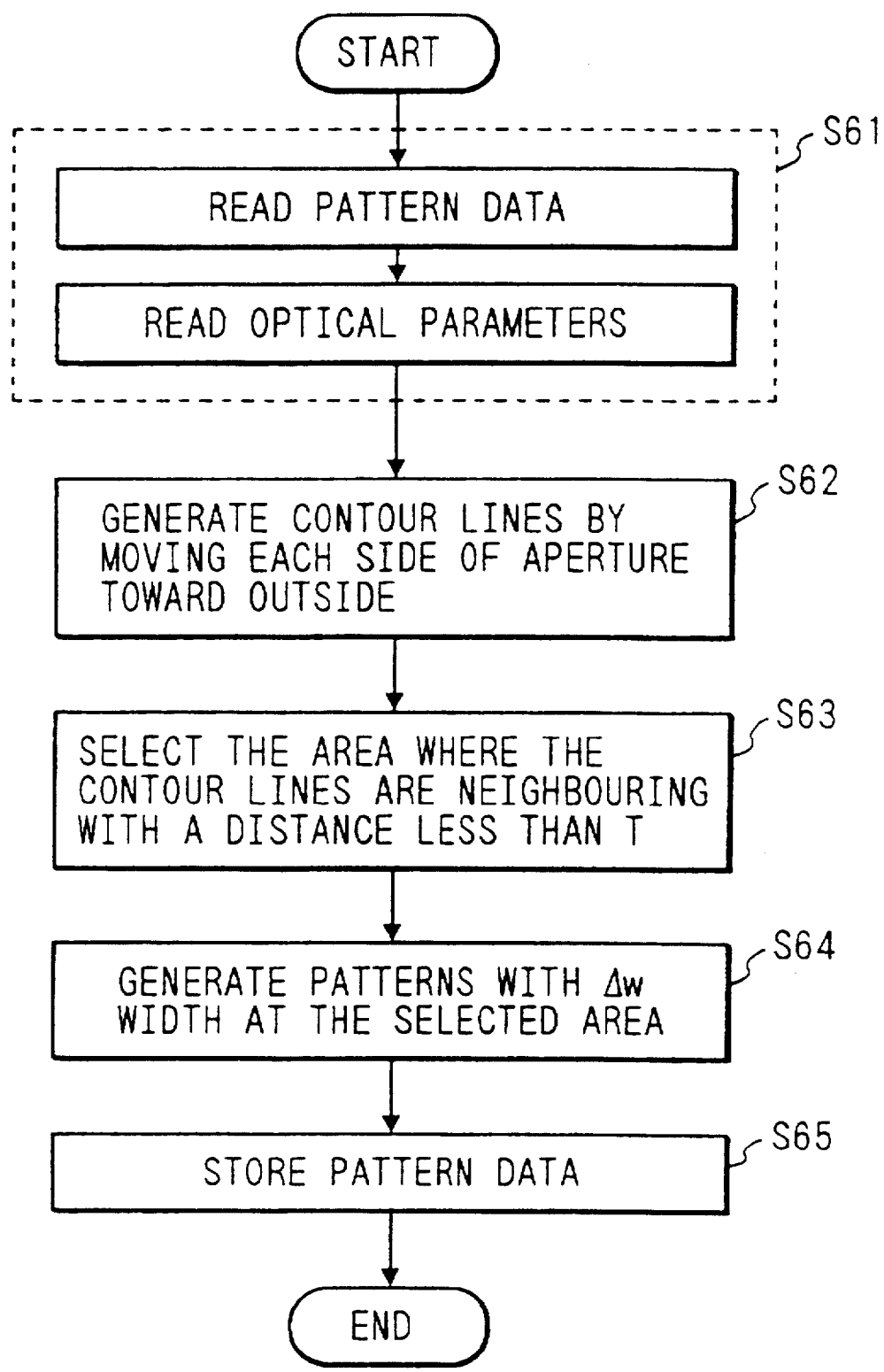
FIG. 29 is a flow chart showing one example of operations of a mask pattern design system in Embodiment 15 of the present invention.

FIG. 29 is a flow chart showing one example of operations of the mask pattern design system shown in FIG. 23. The operations of the system will be described with reference to the flow chart.

At the step 61, data of main patterns of a halftone phase shift mask and parameters of projection optics for printing the mask pattern on a substrate to be exposed are read out.

Figure 30:
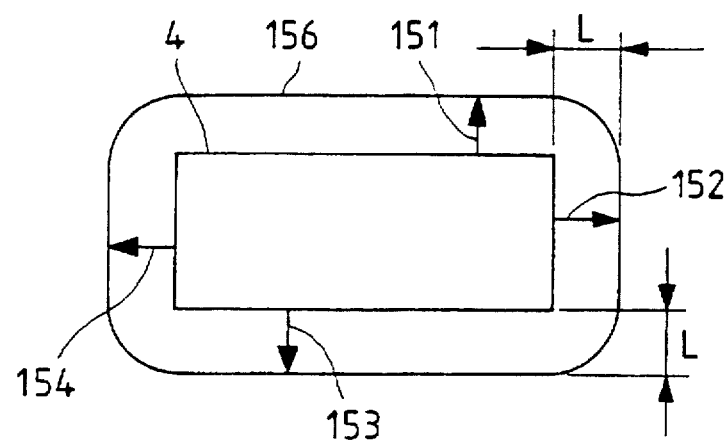
FIG. 30 is a view for illustrating the mask pattern design in Embodiment 15 of the present invention.
Figure 31:
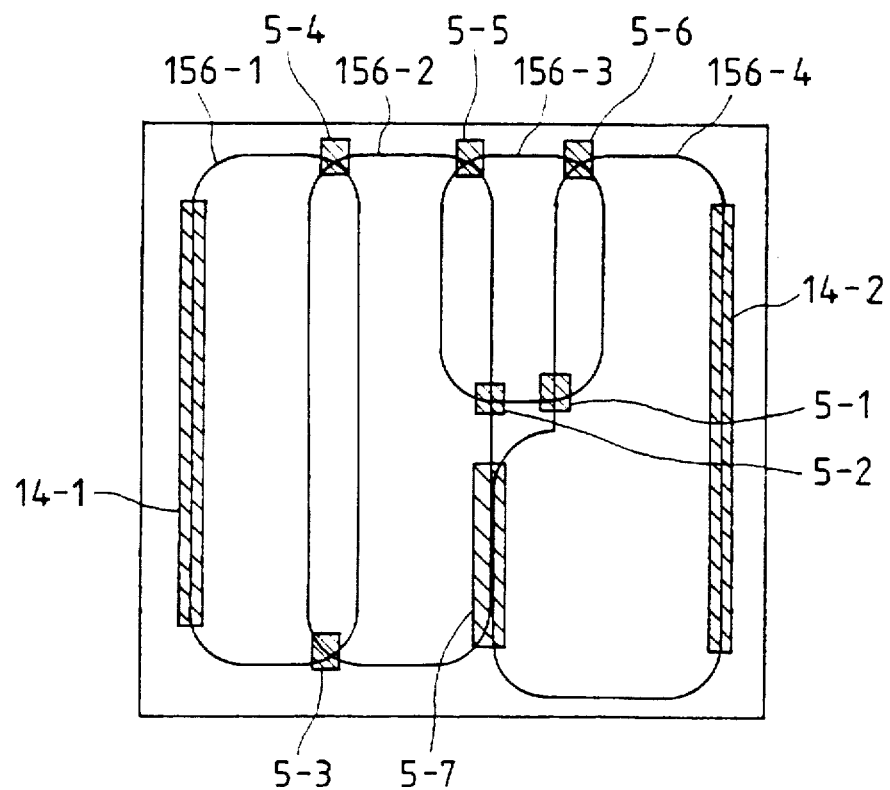
FIG. 31 is a plan view of a photomask in Embodiment 15 of the present invention.
Figure 32A:
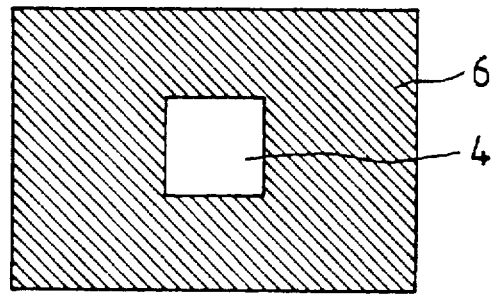
FIG. 32(a) is a plan view of a conventional photomask.
Figure 32B:
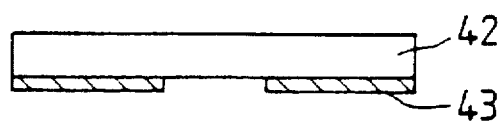
FIG. 32(b) is a sectional view of the photomask shown in FIG. 32(a)
Figure 32C:
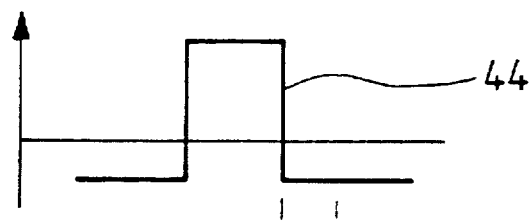
FIG. 32(c) is a view of an amplitude distribution of a light beam passing through the photomask shown in FIG. 32(a)
Figure 32D:
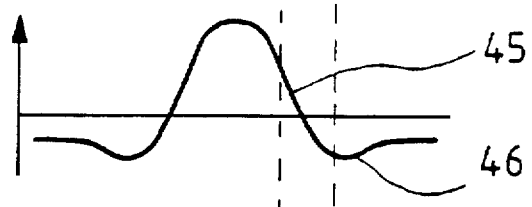
FIG. 32(d) is a view showing a light intensity distribution on a substrate to be exposed.
Figure 32E:
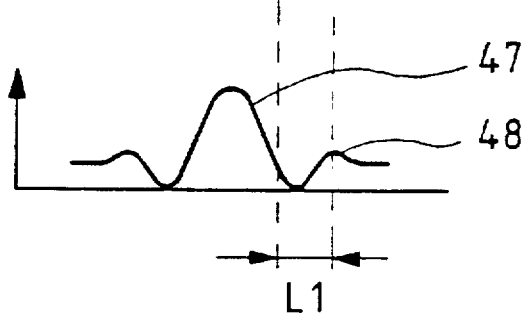
FIG. 32(e) is a view showing a light intensity distribution on a substrate to be exposed.
Figure 33A:
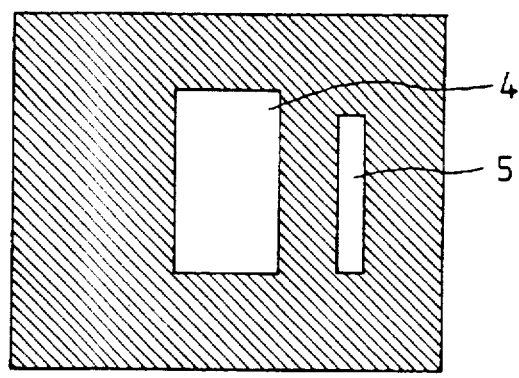
FIG. 33(a) is a plan view of a photomask for illustrating the present invention.
Figure 33B:
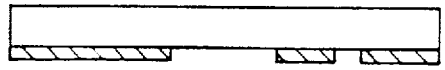
FIG. 33(b) is a sectional view of the photomask shown in FIG. 33(a)
Figure 33C:
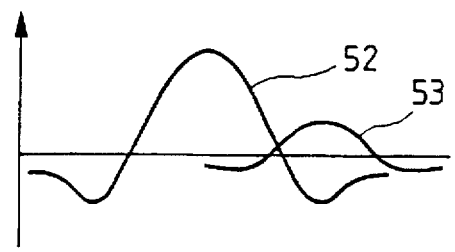
FIG. 33(c) is a view showing the amplitude distribution on a substrate to be exposed.

At the step 62, the contour line of the inputted main pattern is moved outwardly by a specified distance L to enlarge the inputted main pattern, thus generating a contour line of a new graphic form In an example shown in FIG. 30, the sides of an inputted main pattern 4 were moved by the distance L along the directions of the arrows 151, 152, 153 and 154, thus determining the contour line 156 of an enlarged graphic form The same operation was performed for main patterns shown in FIG. 25, to form the contour lines 156-1, 156-2, 156-3 and 156-4 shown in FIG. 31.

After the generation of the enlarged graphic forms of the patterns, at the step 63 in FIG. 29, a position where contour lines are closed to each other within a specified distance or less is detected. The two contour lines may be contacted or crossed to each other. The data of an auxiliary pattern are determined such that an auxiliary pattern is disposed at the above portion at the step 640 The results are stored in a specified file at the step 65. In an example shown in FIG. 31, auxiliary patterns 5-1, 5-2,5-3, 5-4, 5-5, 5-6, 5-7 were given.

Figure 34A:
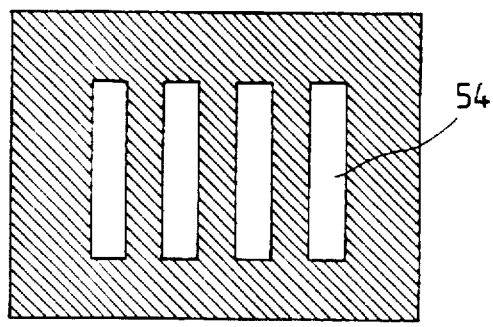
FIG. 34(a) is a plan view of a photomask for illustrating the present invention.
Figure 34B:
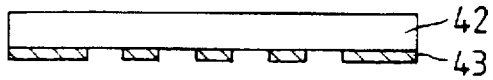
FIG. 34(b) is a sectional view of the photomask shown in FIG. 34(a)
Figure 34C:
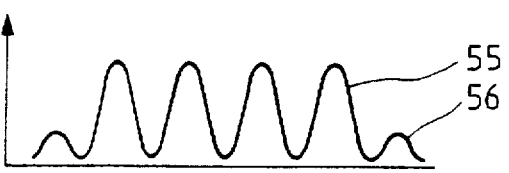
FIG. 34(c) is a view showing an amplitude distribution on a substrate to be exposed.
Figure 37A:
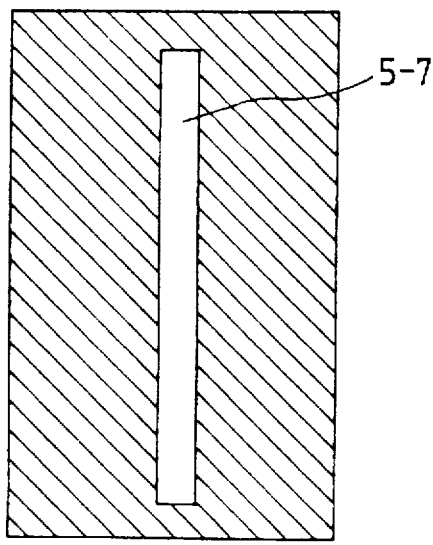
FIG. 37(a) is a plan view of a pattern portion for illustrating a photomask of the present invention.
Figure 37B:
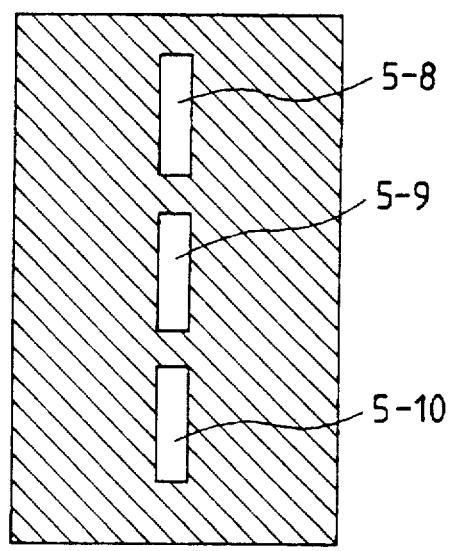
FIG. 37(b) is a plan view of a pattern portion for illustrating a photomask of the present invention.

FIG. 34(a) is a plan view of a photomask; FIG. 34(b) is a sectional view of FIG. 34(a); and FIG. 34(c) shows a light intensity distribution on a substrate to be exposed. As shown in these figures, a side robe is generated outside a pattern gathered portion, and accordingly, auxiliary patterns 14-1 and 14-2 were manually inserted. The size of the pattern is set to be the same as in Embodiment 13. As a result, the same effect as shown in FIG. 28 could be obtained. The auxiliary patterns 14-1 and 14-2 manually provided are not necessarily required, and the size of the pattern at the end portion can be set to be slightly larger with no problem. In addition, auxiliary patterns 14-1 and 14-2 shown in FIG. 31 are longer along one direction as a pattern 5-7 shown in FIG. 37(a). In such a case, as shown in FIG. 37(b), the auxiliary pattern 5-7 is divided into auxiliary patterns 5-8, 5-9 and 5-10, and these divided patterns may be disposed so as to be separated at intervals nearly equivalent to the width of the auxiliary pattern, with the same effect.

<Embodiment 16>

FIG. 41 is a block diagram showing a further example of operations of the mask pattern design system described in Embodiment 15.

A file 121 for storing data of main patterns, an input data reading means 122 and an output file 130 are the same as those in the system shown in FIG. 40. A contour line generating means 131 is adapted to realize the step 62 shown in FIG. 29 and to output the generated contour line to a file 135. A calculating means 132 is adapted to calculate an area where contour lines are closed to each other, and to realize the step 63 shown in FIG. 29. A pattern generating means 133 is adapted to realize the step 64 for determining data of auxiliary patterns. A photomask pattern containing auxiliary patterns is stored in a file 130 by a pattern data storing means 1340

<Embodiment 17>

Figure 38A:
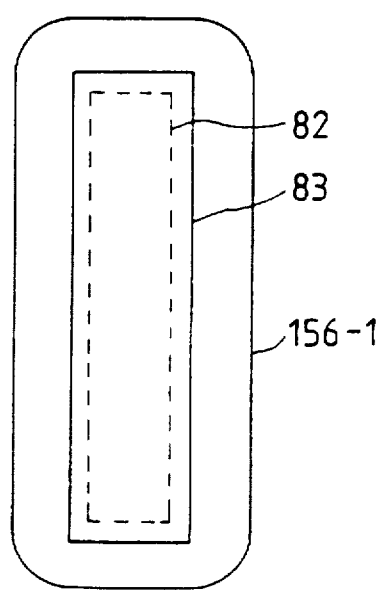
FIG. 38(a) is a plan view of a pattern portion for illustrating a photomask of the present invention.
Figure 38B:
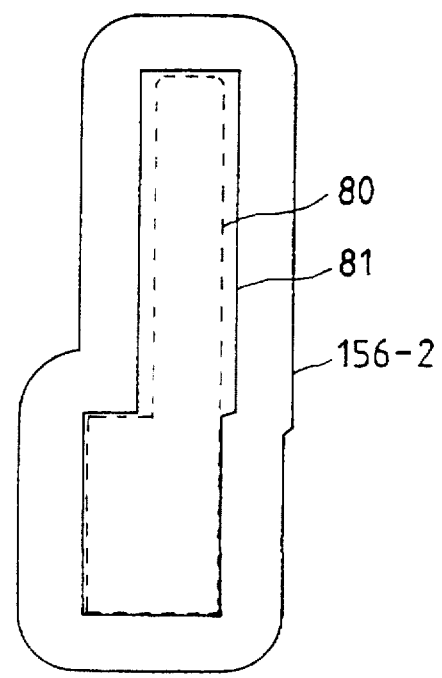
FIG. 38(b) is a plan view of a pattern portion for illustrating a photomask of the present invention.

One example for effectively processing the arrangement of auxiliary patterns will be described. Prior to generation of a contour line of an enlarged graphic form of a pattern, the positional relationship between input patterns is calculated. A pattern not having an adjacent pattern within a distance L' (for example,1.2 λ/NA on a substrate to be exposed), or either side of the pattern is extracted, and when the graphic form has a size near a resolution limit, the width thereof is enlarged by a specified amount. With respect to a pattern having an adjacent pattern within the distance L', the size thereof is not changed. For example, as shown in FIG. 38(a), when a pattern 82 has a width near a resolution limit, the size thereof is enlarged by a specified amount, thus defining a graphic form 83. Similarly, as shown in FIG. 38(b), the fine width of a pattern 80 is enlarged in width, thus defining a graphic form 81. Next, the contour lines shown in FIG. 30 are calculated for all of the input patterns. In the examples shown in FIGS. 38(a) and 38(b), contour lines 156-1 and 156-2 are given. Finally, at a portion where the contour lines are close to each other, an auxiliary pattern is disposed at the step 64 shown in FIG. 29.

Moreover, with respect to the contour line of the pattern in which the size of the input pattern was enlarged by a specified amount, an auxiliary pattern was generated in an area where any adjacent pattern was not present within a distance L'. In the case where the graphic form of the input pattern was longer along one direction and the width thereof was fine, any auxiliary pattern was not disposed while neglecting the contour line corresponding to the vertex portion of the pattern. Similarly, even in the case where the whole or part of the input pattern was large in size and the corresponding contour line was not close to or crossed to another contour line, any auxiliary pattern was not disposed. As a result, the same pattern as shown in FIG. 27 could be obtained.

<Embodiment 18>

Figure 35A:
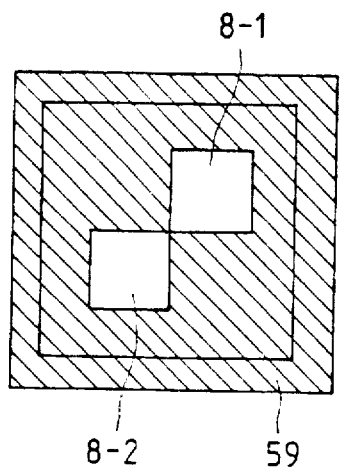
FIG. 35(a) is a plan view of a photomask for illustrating the present invention.
Figure 35B:
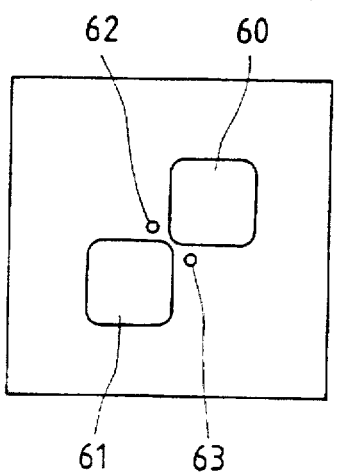
FIG. 35(b) is a light intensity distribution of a projected image projected using the photomask shown in FIG. 35(a)
Figure 35C:
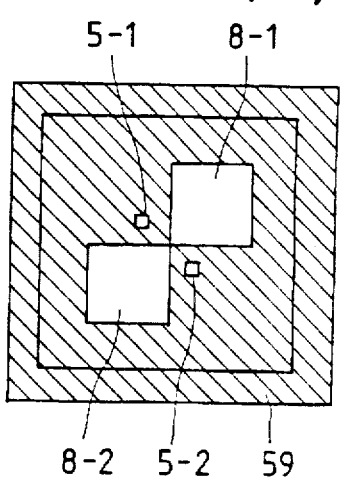
FIG. 35(c) is a plan view of a photomask in Embodiment 18 of the present invention.
Figure 36A:
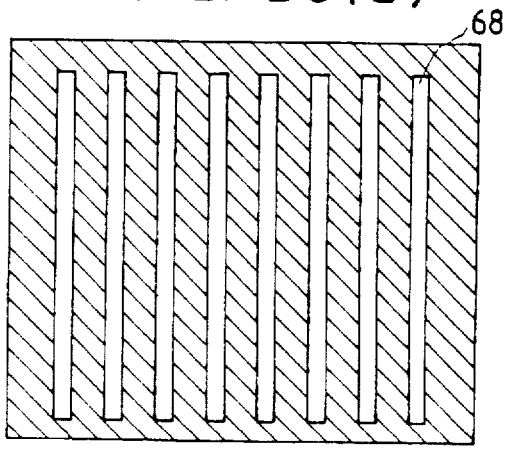
FIG. 36(a) is a partial plan view of a photomask in Embodiment 18 of the present invention.
Figure 36B:
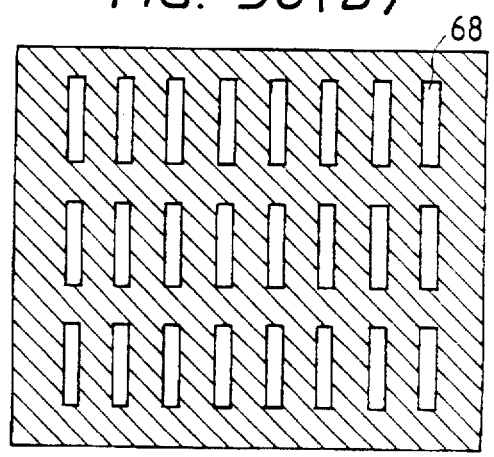
FIG. 36(b) is a partially plan view of a photomask in Embodiment 18 of the present invention.

FIG. 35(a) shows an example in which relatively large main patterns 8-1 and 8-2 are close to each other at corner portions thereof, and an opaque area 59 is set at a peripheral portion. The opaque area is automatically replaced with a finely periodic pattern group 69 as shown in FIG. 36(a) or 36(b) directly after the pattern is inputted. In this case, the area ratio between a light passing area of a halftone periodic pattern and a halftone area is set at √t:1 (t: transmittance of light in the halftone portion), and the period is smaller than the resolution limit of projection optics.

When no auxiliary pattern is provided, unnecessary patterns 62, 63 were projected by the close arrangement of the main patterns 8-1 and 8-2 in addition to projected images 60, 61 of the main patterns 8-1 and 8-2. On the other hand, according to the inventive photomask, the unnecessary patterns 62, 63 were eliminated by provision of two auxiliary patterns 5-1 and 5-2.

In this embodiment, since the calculation of projected images is not required, it becomes possible to determine the positions of auxiliary patterns for short time.

<Embodiment 19>

Main patterns and auxiliary patterns were formed on a photomask using the data determined by the methods shown in Embodiments 13, 15, 17 and 18 in the same manner as in Embodiment 1.

Figure 39:
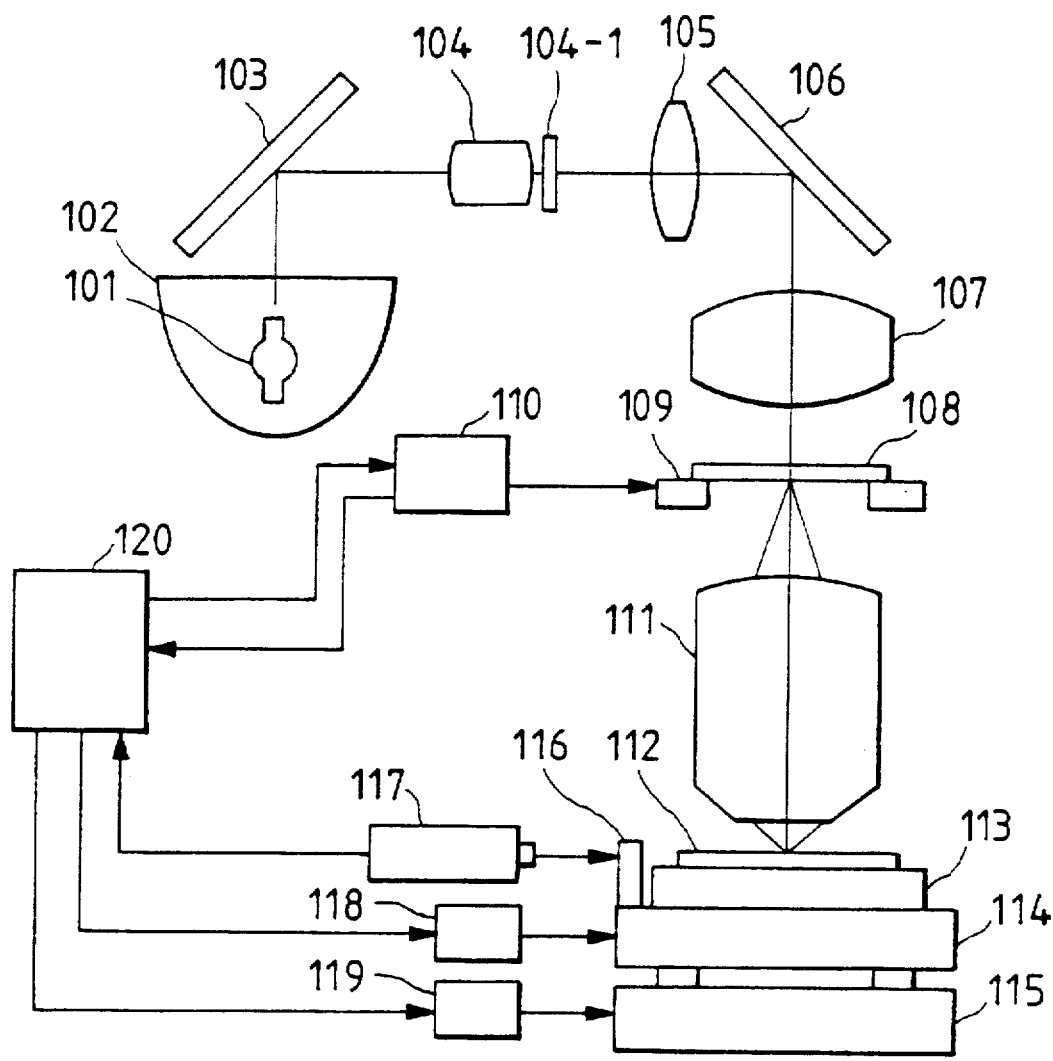
FIG. 39 is a block diagram of a projection exposure system used for the present invention.

A photoresist on a semiconductor substrate was subjected to patterning and exposure using the photomask formed with main patterns and auxiliary patterns by a projection exposure system The block diagram of the projection exposure system is shown in FIG. 39.

A mask 108 was placed on a mask placing base 109 of a projection exposure system, and a pattern was printed on a wafer 112 coated with a resist through a projection lens 111 in a usual manner. A light beam from a light source 101 illuminates the mask 108 by way of a concave mirror 102,mirrors 103 and 106, fly eye lens 104, aperture 104-1, lens systems, 105 and 107. At this time, the effect of a halftone phase shift mask can be obtained by control of the magnitude of the aperture 104-1. The wafer 112 is fixed on the wafer placing base 113, which is mounted on a stage 114 movable in the optical axis direction of the projection lens 111 and a stage 115 movable in the plane vertical to the optical axis. Both the stages 114 and 115 were controlled by drive systems 118 and 119, respectively. The mask placing base 109 was positioned by a mask position control system 110, and the position of the wafer 112 was monitored as the position of the mirror 116 by a laser interference system 117, so that the mask 108 and the wafer 112 are aligned The control of the whole exposure system was performed by a main control system 120. After the pattern printing, a resist pattern was formed by usual development. As a result, a semiconductor device having fine patterns could be manufactured.

In addition, the similar effect can be obtained in the case of a usual Cr mask in place of the halftone phase shift mask. In particular, in the case where the interference becomes stronger by restriction of the aperture 104-1 of the projection exposure system, the effect of arranging auxiliary patterns is made effective.

In the present invention, it becomes possible to easily optimize the shape of an auxiliary pattern by generating the auxiliary pattern for correcting the size of the pattern and the shape error of a projected image by a mask pattern design system Accordingly, a fine pattern can be effectively printed by the projection exposure using such a photomask, and a semiconductor device having a high integration can be easily manufactured.

What is claimed is:

1. A method of forming a pattern comprising the steps of:
   (a) preparing a photomask, said photomask including a first area, in which a semitransparent film is formed and a second area in which the semitransparent film is not formed on a transparent substrate, in which the phase angle of a light beam passing through said first area is inverted as compared with that of a light beam passing through said second area,
   wherein an auxiliary pattern is disposed around a main pattern, and said auxiliary pattern and said main pattern are formed on said second area, and a distance D between a center in a hole pattern or a center line in a line pattern of said main pattern and that of said auxiliary pattern satisfies the relationship of D=bλ/NAm, where NAm is a mask-side numerical aperture of a projection lens, λ is a wavelength of exposure light, and <b> is a coefficient in the range of 1.35<b≦1.9;
   (b) exposing a thin film made of a photoresist formed on a substrate using said photomask by projection optics; and
   (c) forming a pattern by development.

2. A method of forming a pattern according to claim 1, wherein said exposure is performed under a condition that a coherence factor σ of said projection optics satisfies the relationship of σ≦0.3.

3. A method of forming a pattern comprising the steps of:
   (a) preparing a photomask, said photomask including a first area, in which a semitransparent film is formed and a second area, in which the semitransparent film is not formed on a transparent substrate, in which the phase angle of a light beam passing through said first area is inverted as compared with that of a light beam passing through said second area,
   wherein an auxiliary pattern is disposed around a main pattern, and said auxiliary pattern and said main pattern are formed on said second area, and said auxiliary pattern is provided on an area of said photomask corresponding to an area of the projected main pattern which is located outwardly from an intermediate point between a first sub-peak and a second sub-peak generated around said projected main pattern and inwardly from said second sub-peak;
   (b) exposing a thin film made of a photoresist formed on a substrate using said photomask by projection optics; and
   (c) forming a pattern by development.

4. A method of forming a pattern according to claim 3, wherein said exposure is performed under a condition that coherence factor σ of said projection optics satisfies the relationship of σ≦0.3.

5. A method of forming a pattern comprising the steps of:
(a) preparing a photomask, said photomask including a first area, in which a semitransparent film is formed and a second area, in which the semitransparent film is not formed on a transparent substrate, in which the phase angle of a light beam passing through said first area is inverted as compared with that of a light beam passing through said second area, wherein an auxiliary pattern is disposed at an area where an angle formed by intersections of desired two sides or extension lines thereof of a main pattern formed of said area is less than 180° in said first area, and said auxiliary pattern and said main pattern are formed on said second area;

(b) exposing a photoresist formed on a substrate by projection optics using said photomask; and (c) forming a pattern by development.

6. A method of forming pattern comprising the steps of:
(a) preparing a photomask, said photomask including a first area, in which a semitransparent film is formed and a second area, in which the semitransparent film is not formed on a transparent substrate, in which the phase angle of a light beam passing through said first area is inverted as compared with that of a light beam passing through said second area, wherein an auxiliary pattern having a dimension being a resolution limit of projection optics or less is disposed at an area of said photomask corresponding to a position where interference light beams from two different sides of a main pattern overlap each other, and said auxiliary pattern and said main pattern are formed on said second area;

(b) exposing a photoresist formed on a substrate by projection optics using said photomask; and (c) forming a pattern by development.

7. A method of forming a pattern comprising the steps of:
(a) preparing a photomask, said photomask including a first area, in which a semitransparent film is formed and a second area, in which the semitransparent film is not formed on a transparent substrate, in which the phase angle of a light beam passing through said first area is inverted as compared with that of a light beam passing through said second area, wherein at least two main patterns each being formed of said second area are disposed, and a transparent auxiliary pattern forming on said second area and having a dimension being a resolution limit of projection optics or less is disposed at a position in which a distance S from the centers of said two main patterns satisfies the relationship of S=s λ/NAm, wherein NAm is mask-side numerical aperture of a projection lens. λ is a wavelength of exposure light, and <s> is a coefficient in the range of 0.8≦s≦1.1;

(b) exposing a photoresist formed on a substrate by projection optics using said photomask; and (c) forming a pattern by development.

8. A method of forming a pattern comprising the steps of:
(a) preparing a photomask, said photomask including first area, in which a semitransparent film is formed and a second area, in which the semitransparent film is not formed on a transparent substrate, in which the phase angle of a light beam passing through said first area is inverted as compared with that of a light beam passing through said second area, wherein at least two main patterns each being formed of said second area are disposed, and a transparent auxiliary pattern forming on said second area and having a dimension being a resolution limit of projection optics or less is disposed at a position of said photomask corresponding to a position where first sub-peaks around main peaks of the projected main patterns are overlapped to each other;

(b) exposing a photoresist formed on a substrate by projection optics using said photomask; and (c) forming a pattern by development.

9. A method of forming a pattern comprising the steps of:
(a) preparing a photomask, said photomask including a first area, in which a semitransparent film is formed and a second areas in which the semitransparent film is not formed on a transparent substrate, in which the phase angle of a light beam passing through said first area is inverted as compared with that of a light beam passing through said second area, wherein at least two main patterns each being formed of said second area are disposed, and an auxiliary pattern forming on said second area and having a dimension being a resolution limit of projection optics or less is disposed at a position of said photomask corresponding to a position where diffraction light beams from said main patterns are overlapped to each other at the same phase angle;

(b) exposing a photoresist formed on a substrate by projection optics using said photomask; and (c) forming a pattern by development.

10. A method of manufacturing a semiconductor device, comprising:
(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:
  (1) detecting an area where an angle formed by intersections of desired two sides or extension lines thereof of said main pattern is less than 180° in said semitransparent portion, on the basis of data of said main pattern, and
  (2) determining a specified auxiliary pattern in said area where said angle is less than 180°, when said area is detected at a position separated from said desired two sides of said main pattern at specified distances;

(b) forming said main pattern and said determined auxiliary pattern on said photomask, and (c) projecting and exposing a pattern on a thin film made of a photoresist formed on a semiconductor substrate using said photomask formed with said main pattern and said determined auxiliary pattern, thereby forming at least part of a pattern of a semiconductor device.

11. A method of manufacturing a semiconductor device, comprising:
(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) detecting, on the basis of data of at least two of said main patterns and parameters of an optical condition of said projection optics, a position in which a distance S from the centers of said main patterns satisfies the relationship of $S=s\lambda/NAm$, where $NAm$ is a mask-side numerical aperture of a projection lens, $\lambda$ is a wavelength of exposure light, and $<s>$ is a coefficient in the range of $0.8 \leq s \leq 1.1$, and
  (2) determining an auxiliary pattern having a dimension of a resolution limit or less of said projection optics at said position satisfying said relationship when said position is detected;

(b) forming said main pattern and said determined auxiliary pattern on said photomask, and (c) projecting and exposing a pattern on a thin film made of a photoresist formed on a semiconductor substrate using said photomask formed with said main pattern and said determined auxiliary pattern, thereby forming at least part of a pattern of a semiconductor device.

12. A method of manufacturing a semiconductor device, comprising:

(a) preparing a photomask including a semitransparent area and a transparent area for at least exposure light, in which the phase angle of a light beam passing through said semitransparent area is inverted as compared with that of a light beam sassing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) calculating on the basis of data of at least two of said main patterns and parameters representing an optical condition of said projection optics, light intensity distributions of projected images of said main patterns,
  (2) detecting a position where first sub-peaks around main peaks of said main patterns in said light intensity distributions of said projected images of said main patterns are overlapped to each other, and
  (3) determining an auxiliary pattern having a dimension of a resolution limit or less of said projection optics at a position of said photomask corresponding to said position when said position is detected;

(b) forming said main pattern and said determined auxiliary pattern on said photomask, and (c) projecting and exposing a pattern on a thin film made of photoresist formed on a semiconductor substrate using said photomask formed with said main pattern and said determined auxiliary pattern, thereby forming at least part of a pattern of a semiconductor device.

13. A method of manufacturing a semiconductor device, comprising;

(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) detecting, on the basis of data of at least two of said main patterns and parameters representing an optical condition of said projection optics, a position where diffraction light beams from said main patterns are overlapped to each other at the same phase angle, and
  (2) determining an auxiliary pattern having a dimension of a resolution limit or less of said projection optics at a position of said photomask corresponding to said position when said position is detected;

(b) forming said main pattern and said determined auxiliary pattern on said photomask, and (c) projecting and exposing a pattern on a thin film made of a photoresist formed on a semiconductor substrate using said photomask formed with said main pattern and said determined auxiliary pattern, thereby forming at least part of a pattern of a semiconductor device.

14. A method of manufacturing a semiconductor device comprising of steps:

(a) determining an auxiliary pattern of a photomask used for pattern printing by projection optics using a mask pattern design system, said process of determining said auxiliary pattern comprising the steps of:

(1) calculating, on the basis of data of at least one main pattern forming said photomask and parameters representing an optical condition of said projection optics, a light intensity distribution of a projected image of said main pattern obtained by said projection optics,
  (2) determining an area where a light intensity is more than a specified value, excluding an area corresponding to said main pattern, on the basis of said light intensity distribution of the projected image, and
  (3) determining one or a plurality of auxiliary patterns on an area of said photomask corresponding to said area where the light intensity is more than said specified value when said area is determined.

(b) forming said main pattern and said determined auxiliary pattern on said photomask, and (c) projecting and exposing a pattern on a thin film made of a photoresist formed on a semiconductor substrate using said photomask formed with said main pattern and said determined auxiliary pattern, thereby forming at least part of a pattern of a semiconductor device.

15. A method of manufacturing a semiconductor device according to claim 14, wherein said photomask comprises a semitransparent area and a transparent area for at least exposure light, in which the phase angle of a light beam passing through said semitransparent area is inverted as compared with that of a light beam passing through said transparent area, and each of said main pattern and said auxiliary pattern is formed of said transparent area and has the same phase angle of light.

16. A method of manufacturing a semiconductor device comprising the steps of:

(a) determining an auxiliary pattern of a photomask used for pattern printing by projection optics using a mask pattern design system, said process of determining said auxiliary pattern comprising the steps of:

(1) moving, on the basis of data of at least two of main pattern forming said photomask, an contour line of each of said main patterns outwardly by a specified distance L, thereby determining the enlarged contour line of each of said main patterns, (2) detecting a position where said enlarged contour lines are close to each other at a specified distance M or less, and (3) determining one or a plurality of auxiliary patterns of a specified shape on said position where said enlarged contour lines are close to each other when said position is determined, (b) forming said main pattern and said determined auxiliary pattern on said photomask, and (c) projecting and exposing a pattern on a thin film made of a photoresist formed on a semiconductor substrate using said photomask formed with said main pattern and said determined auxiliary pattern, thereby forming at least part of a pattern of a semiconductor device.

17. A method of manufacturing a semiconductor device according to claim 16, wherein said photomask comprises a semitransparent area and a transparent area for at least exposure light, in which the phase angle of a light beam passing through said semitransparent area is inverted as compared with that of a light beam passing through said transparent area, and each of said main pattern and said auxiliary pattern is formed of said transparent area and has the same phase angle of light.

18. A method of manufacturing a semiconductor device according to claim 16, wherein said specified distance L satisfies the relationship of $L=k_1 \lambda/NAm$, where NAm is a mask-side numerical aperture of a projection lens, $\lambda$ is a wavelength of exposure light, and $<k_1>$ is a coefficient in the range of $0.4 \leq k_1 \leq 1.1$.

19. A method of manufacturing a semiconductor device according to claim 16, wherein said auxiliary pattern is formed in a shape of a square, rectangle or the combination thereof, and the length of one side (in the case of the square) or of short-side (in the case of the rectangle) is $k_2 \lambda/NAm$, where NAm is a mask-side numerical aperture of a projection lens, $\lambda$ is a wavelength of exposure light, and $<k_2>$ is a coefficient in the range of $0.05 \leq k_2 \leq 0.4$.

20. A method of manufacturing a semiconductor device, comprising:

(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) determining a first auxiliary pattern of a specified shape on a position in which a distance between the center or a specified center line of said main pattern and that of said first auxiliary pattern satisfies the relationship of $D=b"\lambda/NAm$ where NAm is a mask-side numerical aperture of a projection lens $\lambda$ is a wavelength of exposure light, and $<b">$ is a coefficient, on the basis of data of said main pattern and parameters representing an optical condition of said projection optics, (2) judging a contradiction portion of said first auxiliary pattern, and (3) determining an auxiliary pattern to be arranged on the basis of said first auxiliary pattern and said contradiction portion, (b) forming said main pattern and said auxiliary pattern to be arranged, on said photomask, and (c) projecting and exposing a pattern on a thin film made of a photoresist formed on a semiconductor substrate using said photomask formed with said main pattern and said auxiliary pattern to be arranged, thereby forming at least part of a pattern of a semiconductor device.

21. A method of manufacturing a semiconductor device according to claim 20, wherein said coefficient $<b">$ is in the range of $1.0 \leq b" \leq 2.0$.

22. A method of manufacturing a semiconductor device according to claim 20, wherein said coefficient $<b">$ is in the range of $1.35 \leq b" \leq 1.9$.

23. A method of manufacturing a semiconductor device according to claim 20, wherein the determination of said first auxiliary pattern is performed by the step of detecting a main pattern having a size being a specified value or less, and determining said first auxiliary pattern at said position for said detected main pattern.

24. A method of manufacturing a semiconductor device, comprising:

(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) calculating a light intensity distribution of a projected image of said main pattern on the basis of data of said main pattern and parameters representing an optical condition of said projection optics, (2) determining a first auxiliary pattern of a specified shape on an area of said photomask corresponding to an area of the projected main pattern which is located outwardly from an intermediate point between a first sub-peak and a second sub-peak generated around said projected main pattern and inwardly from said second sub-peak, (3) judging a contradiction portion of said first auxiliary pattern, and (4) determining an auxiliary pattern to be arranged on the basis of said first auxiliary pattern and said contradiction portion, (b) forming said main pattern and said auxiliary pattern to be arranged, on said photomask, and (c) projecting and exposing a pattern on a thin film made of a photoresist formed on a semiconductor substrate using said photomask formed with said main pattern and said auxiliary pattern to be arranged, thereby forming at least part of a pattern of a semiconductor device.

25. A method of manufacturing a semiconductor device according to claim 24, wherein the determination of said first auxiliary pattern is performed by the step of detecting a main pattern having a size being a specified value or less, and determining said first auxiliary pattern at said position for said detected main pattern.

26. A method of manufacturing a semiconductor device, comprising:

(a) preparing a photomask including a semitransparent area and a transparent area for at least exposure light, in which the phase angle of a light beam passing through said semitransparent area is inverted as compared with that of a light beam passing through said transparent area and said main pattern is formed of said transparent area; and determining an auxiliary transparent pattern having the same phase angle of a light beam passing therethrough as that of a light beam passing through said transparent area around said main pattern by a mask pattern design system, said process of determining said auxiliary pattern comprising the steps of:

(1) calculating a light intensity distribution of a projected image of said main pattern on the basis of data of said main pattern and parameters representing an optical condition of said projection optics, (2) determining a first auxiliary pattern of a specified shape on an area of said photomask corresponding to an area of the projected main pattern which is located outwardly from an intermediate point between a first sub-peak and a second sub-peak generated around said projected main pattern and inwardly from said second sub-peak, (3) judging a contradiction portion of said first auxiliary pattern, and (4) determining a projected image of an auxiliary pattern to be arranged on the basis of said first auxiliary pattern and said contradiction portion, (5) determining an auxiliary pattern to be arranged, on an area of said photomask corresponding to said projected image on the basis of said projected image of said auxiliary pattern to be arranged, (b) forming said main pattern and said auxiliary pattern to be arranged, on said photomask, and (c) projecting and exposing a pattern on a thin film made of a photoresist formed on a semiconductor substrate using said photomask formed with said main pattern and said auxiliary pattern to be arranged, thereby forming at least part of a pattern of a semiconductor device.

27. A method of manufacturing a semiconductor device according to claim 26, wherein the determination of said first auxiliary pattern is performed by the step of detecting a main pattern having a size being a specified value or less, and determining said first auxiliary pattern for said detected main pattern on said area outwardly from an intermediate point between said first sub-peak and said second sub-peak and inwardly from said second sub-peak.

* * * * *